(12) United States Patent
Petrov

(10) Patent No.: US 9,882,749 B2
(45) Date of Patent: *Jan. 30, 2018

(54) TRANSMISSION METHOD, TRANSMITTER, RECEPTION METHOD, AND RECEIVER

(71) Applicant: Sun Patent Trust, New York, NY (US)

(72) Inventor: Mihail Petrov, Bavaria (DE)

(73) Assignee: SUN PATENT TRUST, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/484,421

(22) Filed: Apr. 11, 2017

(65) Prior Publication Data

US 2017/0222838 A1   Aug. 3, 2017

Related U.S. Application Data

(63) Continuation of application No. 14/415,845, filed as application No. PCT/JP2013/004549 on Jul. 26, 2013, now Pat. No. 9,654,316.

(30) Foreign Application Priority Data

Jul. 27, 2012 (EP) .................................... 12178273
Jul. 27, 2012 (EP) .................................... 12178274

(51) Int. Cl.
*H04L 25/03* (2006.01)
*H03M 13/11* (2006.01)
(Continued)

(52) U.S. Cl.
CPC ....... *H04L 25/0391* (2013.01); *H03M 13/116* (2013.01); *H03M 13/1165* (2013.01);
(Continued)

(58) Field of Classification Search
CPC . H04L 1/0041; H04L 1/0057; H04L 25/0391; H04L 27/2627; H04L 27/2649;
(Continued)

(56) References Cited

U.S. PATENT DOCUMENTS

2006/0156169 A1* 7/2006 Shen .................. H03M 13/1148
                                                                714/752
2009/0125780 A1   5/2009 Taylor et al.
(Continued)

FOREIGN PATENT DOCUMENTS

EP          1 667 349        6/2006
EP          2 288 048        2/2011
(Continued)

OTHER PUBLICATIONS

International Search Report dated Sep. 3, 2013 in International (PCT) Application No. PCT/JP2013/004549.
(Continued)

*Primary Examiner* — Syed Haider
(74) *Attorney, Agent, or Firm* — Wenderoth, Lind & Ponack, L.L.P.

(57) ABSTRACT

In order to transmit a codeword that is generated based on a quasi-cyclic low-density parity-check coding scheme and consists of N cyclic blocks each consisting of Q bits, a bit permutation is applied to the bits of the codeword, a plurality of constellation blocks each consisting of G×M bits are generated, and a block permutation is applied to the constellation blocks. The bit permutation is adopted for each of N/M sections each consisting M cyclic blocks such that the constellation blocks each consist of G×M bits from M distinct cyclic blocks of the associated section. The block permutation is equivalent to writing the constellation blocks into a matrix with R rows and (Q/(k×G)) columns and
(Continued)

reading out the constellation blocks column by column from the matrix, where R is k×(N/M), and k is a positive integer.

4 Claims, 18 Drawing Sheets

(51) Int. Cl.
*H03M 13/25* (2006.01)
*H03M 13/27* (2006.01)
*H04L 27/26* (2006.01)
*H04L 27/36* (2006.01)
*H04L 1/00* (2006.01)

(52) U.S. Cl.
CPC ..... *H03M 13/1185* (2013.01); *H03M 13/255* (2013.01); *H03M 13/2707* (2013.01); *H04L 1/0041* (2013.01); *H04L 1/0057* (2013.01); *H04L 1/0071* (2013.01); *H04L 27/2627* (2013.01); *H04L 27/2649* (2013.01); *H04L 27/366* (2013.01)

(58) Field of Classification Search
CPC .......................... H04L 27/366; H04L 1/0071; H03M 13/1165; H03M 13/1185; H03M 13/2707; H03M 13/116; H03M 13/255
See application file for complete search history.

(56) References Cited

U.S. PATENT DOCUMENTS

| | | | | |
|---|---|---|---|---|
| 2009/0180495 | A1* | 7/2009 | Li | H03M 13/11 370/479 |
| 2009/0217123 | A1* | 8/2009 | Dore | H03M 13/1105 714/752 |
| 2011/0103502 | A1 | 5/2011 | Vitale et al. | |
| 2011/0182345 | A1* | 7/2011 | Lei | H03M 13/11 375/227 |

FOREIGN PATENT DOCUMENTS

| | | |
|---|---|---|
| JP | 2011-514090 A | 4/2011 |
| WO | 2009/109830 | 9/2009 |
| WO | 2012/098984 | 7/2012 |

OTHER PUBLICATIONS

Catherine Douillard et al., "The Bit Interleaved Coded Modulation module for DVB-NGH: Enhanced features for mobile Reception", Telecommunications (ICT), 2012 19$^{th}$ International Conference on, Apr. 25, 2012.

Digital Video Broadcasting (DVB); Frame structure channel coding and modulation for a second generation digital terrestrial television broadcasting system (DVB-T2), ETSI EN 302 755, pp. 50-52, Apr. 12, 2012.

ETSI EN 302 307 V1.2.1 (Aug. 2009), Digital Video Broadcasting (DVB); Second generation framing structure, channel coding and modulation systems for Broadcasting, Interactive Services, News Gathering and other broadband satellite applications (DVB-S2), Aug. 2009.

Final draft ETSI EN 302 755 V1.3.1 (Nov. 2011), Digital Video Broadcasting (DVB); Frame structure channel coding and modulation for a second generation digital terrestrial television broadcasting system (DVB-T2), Nov. 2011.

Final draft ETSI EN 302 769 V1.2.1 (Dec. 2010), Digital Video Broadcasting (DVB); Frame structure channel coding and modulation for a second generation digital transmission system for cable systems (DVB-C2), Dec. 2010.

ETSI EN 300 744 V1.6.1 (Jan. 2009), Digital Video Broadcasting (DVB); Framing structure, channel coding and modulation for digital terrestrial television, Jan. 2009.

Mikel Mendicute, et al., "DVB-T2: New Signal Processing Algorithms for a Challenging Digital Video Broadcasting Standard", Internet Citation, pp. 185-206, XP002675633, ISBN: 978-953-7619-70-1, Retrieved from the Internet: URL: http://cdn.intechopen.com/pdfs/8519/InTech-Dvb_t2_new_signal_processing_algorithms_for_a_challenging_digital_video_broadcasting_standard.pdf, Feb. 1, 2010.

European Search Report dated Sep. 12, 2012 in European Patent Application No. EP 12 17 8273.4.

European Search Report dated Jan. 4, 2013 in European Patent Application No. EP 12 17 8274.2.

Extended European Search Report dated Feb. 25, 2016 in corresponding European Application No. 13823664.1.

DVB Organization: "TM-NGH1172_DetailsTI_FhG.ppt", DVB, Digital Video Broadcasting, C/0 EBU-17A Ancienne Route-CH-1218 Grand Saconnex, Geneva-Switzerland, Sep. 22, 2011 (Sep. 22, 2011), XP017836692, *Slides 1-28*.

* cited by examiner

FIG. 4
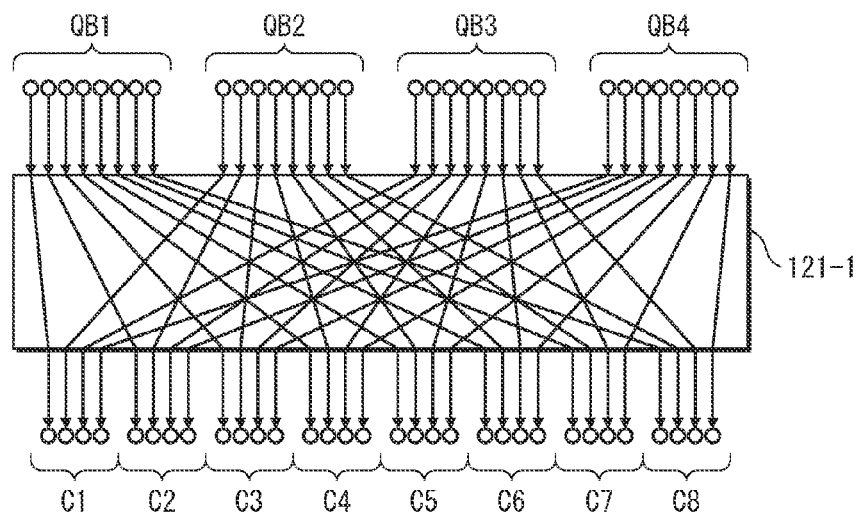
FIG. 5
(a) Writing process
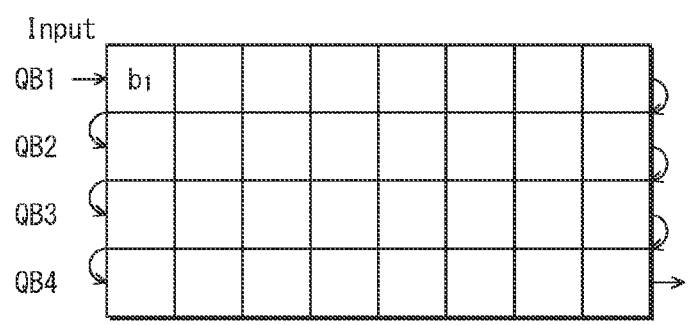
(b) Reading process
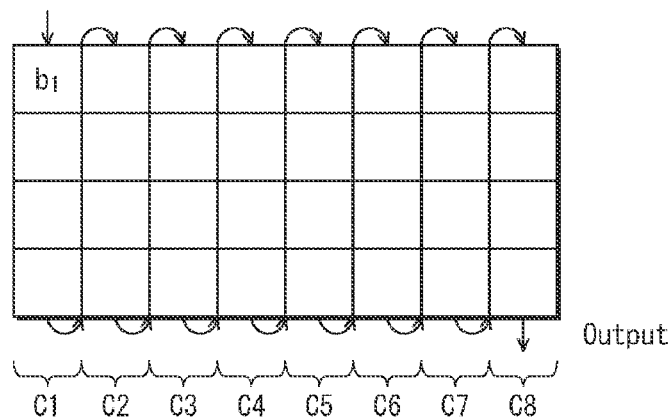

FIG. 12
(a) Writing process
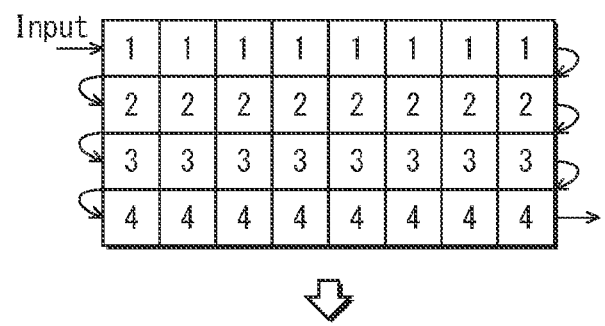
(b) Reading process
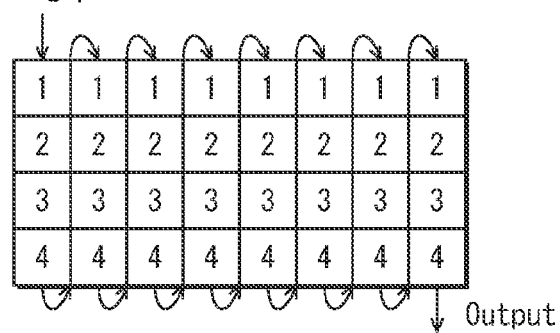
FIG. 13
(a) Writing process
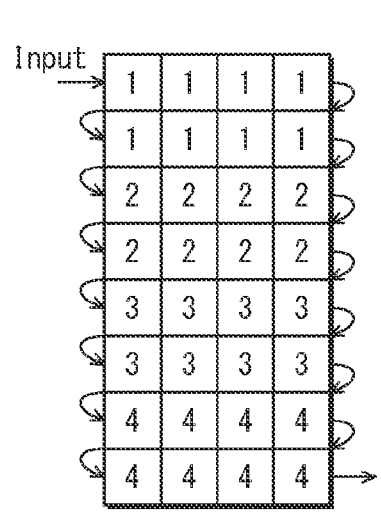
(b) Reading process
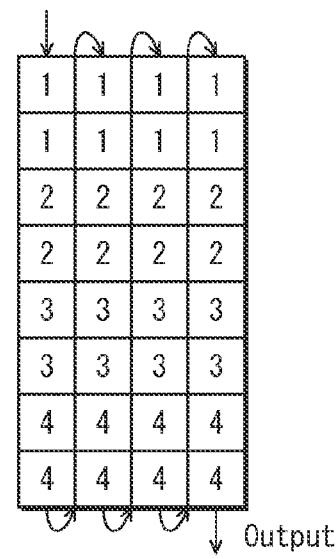

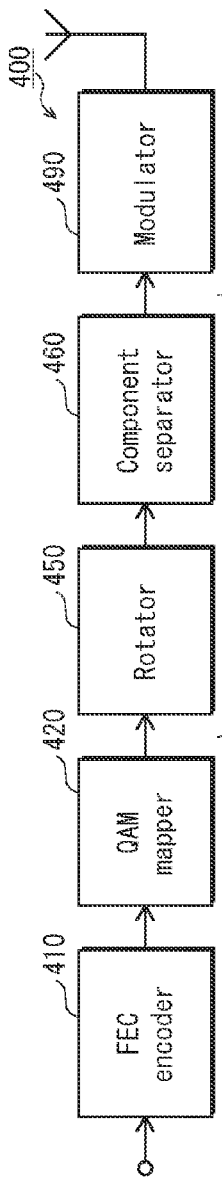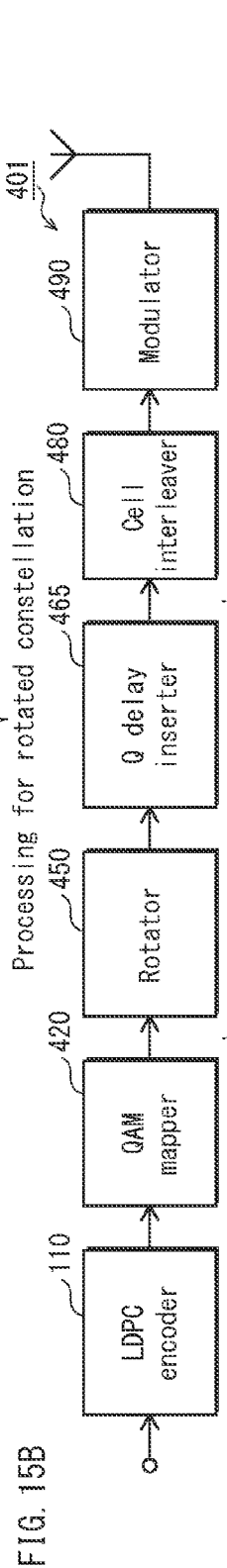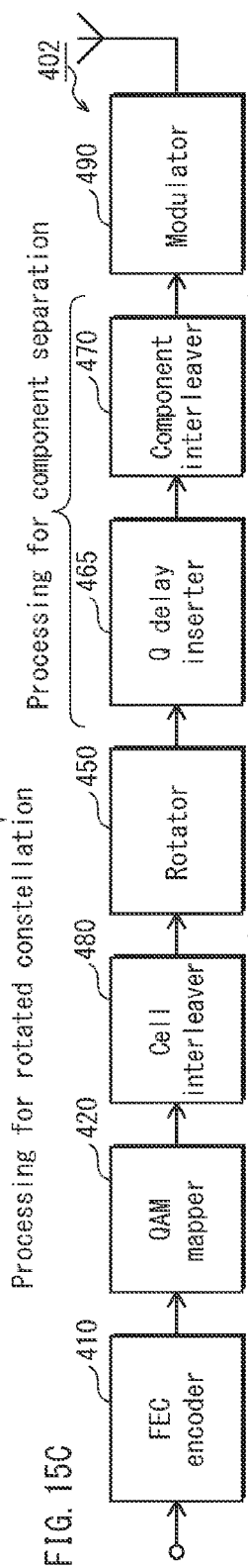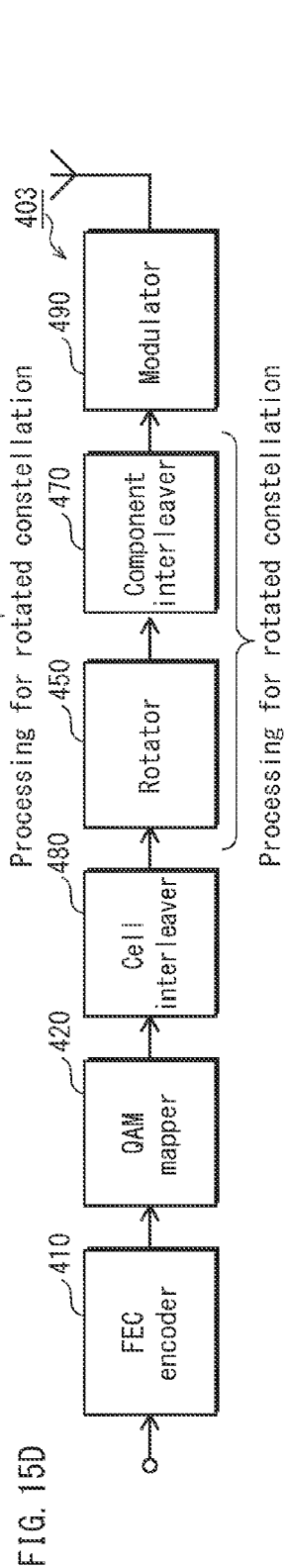

| 1 | 2 | 3 | 4 | 5 | 6 | 7 | 8 | 9 | 10 | 11 | 12 |
| 1 | 2 | 3 | 4 | 5 | 6 | 7 | 8 | 9 | 10 | 11 | 12 |

⎫ CB (b) 4D-RC

| 1 | 2 | 2 | 3 | 3 | 4 | 4 | 5 | 5 | 6 | 6 |
| 1 | 2 | 2 | 3 | 3 | 4 | 4 | 5 | 5 | 6 | 6 |

⎫ CB (c)

| 1 | 2 | 3 | 4 | 5 | 6 | 7 | 8 | 9 | 10 | 11 | 12 |
| 12| 1 | 2 | 3 | 4 | 5 | 6 | 7 | 8 | 9  | 10 | 11 |

(d)

| 1 | 2 | 2 | 3 | 3 | 4 | 4 | 5 | 5 | 6 | 6 |
| 6 | 1 | 1 | 2 | 2 | 3 | 3 | 4 | 4 | 5 | 5 |

FIG. 17
2D-RC
(a) Writing process
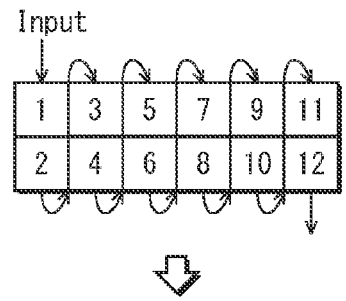
(b) Reading process
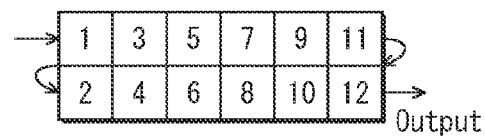
FIG. 18
4D-RC
(a) Writing process
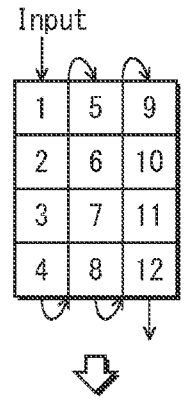
(b) Reading process
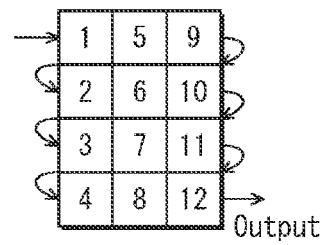

FIG. 21
2D-RC
(a) Writing process
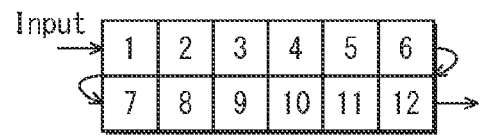
(b) Reading process
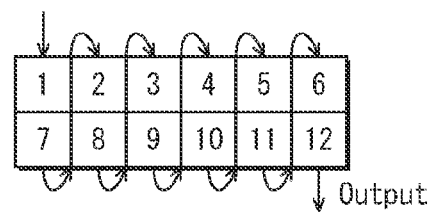
FIG. 22
4D-RC
(a) Writing process
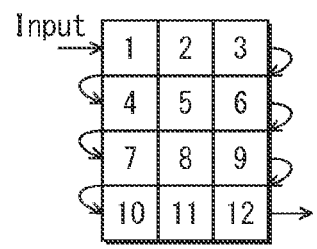
(b) Reading process
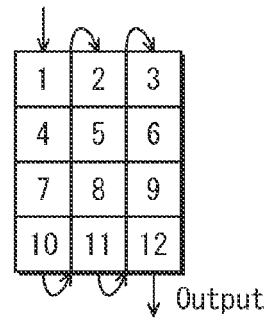

4D-RC

2D-RC

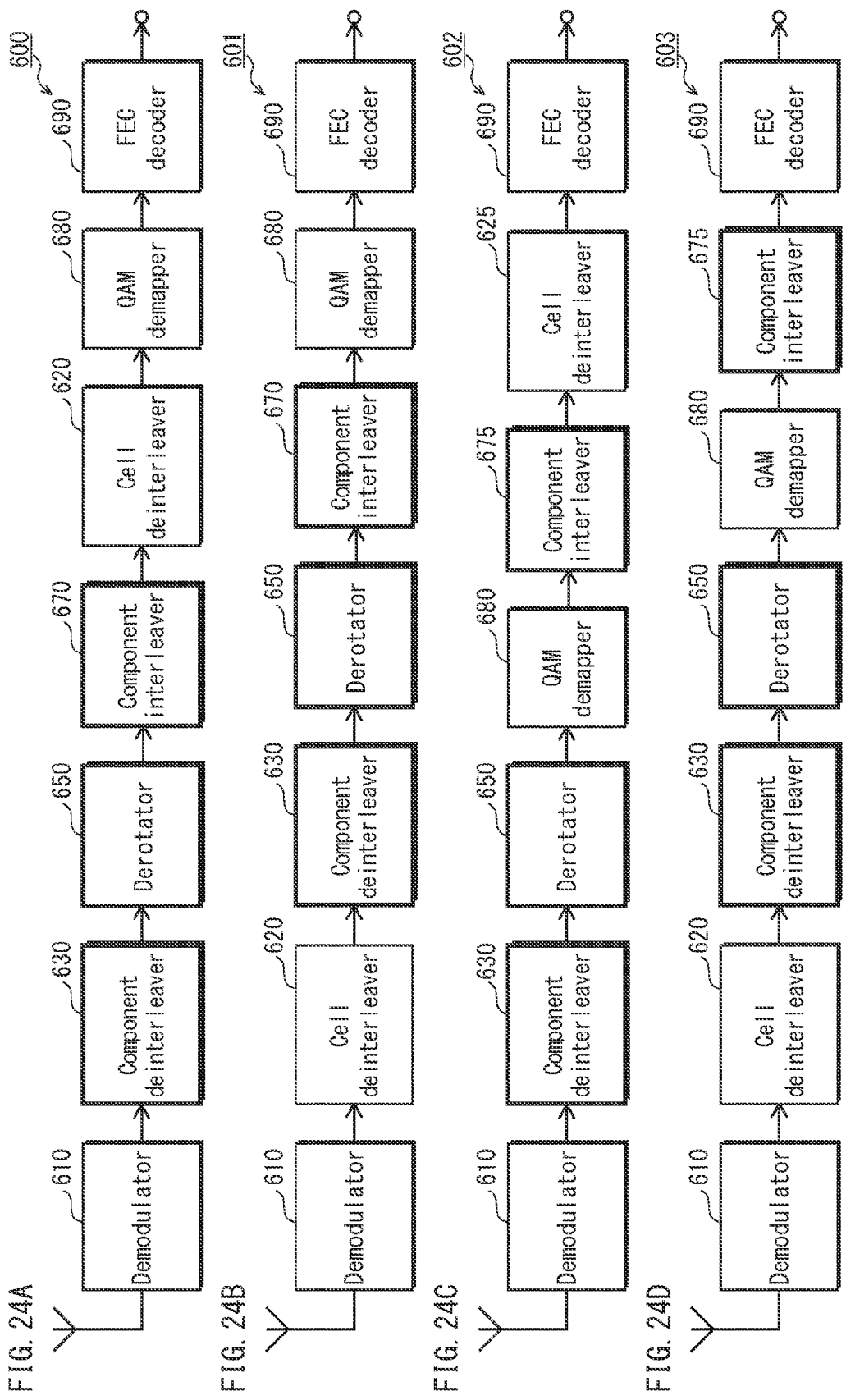

TRANSMISSION METHOD, TRANSMITTER, RECEPTION METHOD, AND RECEIVER

TECHNICAL FIELD

The present invention relates to the field of digital communications.

BACKGROUND ART

The transmission method disclosed in Non-Patent Literature 1 includes: (1) a step of encoding a data block with a forward error correction code (FEC code); (2) a step of mapping bits of a codeword resulting from the encoding to complex cells; and (3) a step of applying a cell interleaving to the complex cells resulting from the mapping.

The cell interleaving is processing for spreading bits that are influenced by burst errors that occur in channels (over the entire codeword), and is known as being useful as a means for improving the reception performance.

CITATION LIST

Non-Patent Literature

[Non-Patent Literature 1] DVB-NGH standardization document, TM-NGH1181r16 (upcoming DVB-NGH standard)

[Non-Patent Literature 2] ETSI EN 302 755 (DVB-T2 standard)

[Non-Patent Literature 3] ETSI EN 300 744 (DVB-T standard)

[Non-Patent Literature 4] ETSI EN 302 307 (DVB-S2 standard)

[Non-Patent Literature 5] ETSI EN 302 769 (DVB-C2 standard)

SUMMARY OF INVENTION

By the way, various types of transmission arts have been proposed in recent years, and a situation is arising where conventional cell interleaving sometimes cannot sufficiently improve the reception performance in the communication systems.

The present invention aims to provide a transmission method that improves the reception performance in the communication systems.

In order to achieve the above aim, the present invention provides a transmission method for transmitting a codeword generated based on a quasi-cyclic low-density parity-check coding scheme including a repeat-accumulate quasi-cyclic low-density parity-check coding scheme, the codeword consisting of N quasi-cyclic blocks, the quasi-cyclic blocks each consisting of Q bits, the transmission method comprising the steps of: applying a bit permutation to the bits of the codeword; dividing the permuted bits of the codeword into a plurality of constellation blocks each consisting of G×M bits; applying a constellation block permutation to the constellation blocks; and transmitting the permuted constellation blocks, wherein the codeword is divided into N/M sections each consisting of M quasi-cyclic blocks, the constellation blocks are each associated with one of the sections, the bit permutation is adapted such that the constellation blocks each consist of G×M bits from M different quasi-cyclic blocks of the associated section, and the constellation block permutation is equivalent to writing the constellation blocks row by row into a matrix with R rows and (Q/(k×G)) columns and reading out the constellation blocks column by column from the matrix, where R is k×(N/M), and k is a positive integer.

According to the above transmission method, it is possible to improve the reception performance in the communication systems.

BRIEF DESCRIPTION OF DRAWINGS

FIG. 4 is a figure explaining the outline of section permutation in FIG. 3.

FIG. 5 shows an example of writing a plurality of bits of a code block into a section permutation matrix in part (a), and an example of reading out the plurality of bits of the code block from the section permutation matrix in part (b).

FIG. 12 shows an example of writing constellation blocks into a constellation block permutation matrix in part (a), and an example of reading out the constellation blocks from the constellation block permutation matrix in part (b).

FIG. 13 shows another example of writing constellation blocks into a constellation block permutation matrix in part (a), and another example of reading out the constellation blocks from the constellation block permutation matrix in part (b).

FIG. 15A to FIG. 15D are block diagrams respectively showing the configuration of generic transmitters 400, 401, 402, and 403 employing a rotation.

FIG. 16 shows, in parts (a) to (d), an example of output from a rotator 450 included in a transmitter 402 employing a two-dimensional rotation, an example of output from the rotator 450 included in the transmitter 402 employing a four-dimensional rotation, an example of processing performed by a Q delay inserter 465, corresponding to the example of part (a), and an example of processing performed by the Q delay inserter 465, corresponding to the example of part (b), respectively.

FIG. 17 shows an example of writing complex cells into a component permutation matrix by a component interleaver 470 employing a two-dimensional rotation in part (a), and an example of reading out the complex cells from the component permutation matrix by the component interleaver 470 employing the two-dimensional rotation in part (b).

FIG. 18 shows an example of writing complex cells into a component permutation matrix by the component interleaver 470 employing a four-dimensional rotation in part (a), and an example of reading out the complex cells from the component permutation matrix by the component interleaver 470 employing the four-dimensional rotation in part (b).

FIG. 21 shows an example of writing components into a component permutation matrix by a component deinterleaver 570 employing a two-dimensional rotation in part (a), and an example of reading out the components from the component permutation matrix by the component deinterleaver 570 employing the two-dimensional rotation in part (b).

FIG. 22 shows an example of writing components into a component permutation matrix by the component deinterleaver 570 employing a four-dimensional rotation in part (a), and an example of reading out the components from the component permutation matrix by the component deinterleaver 570 employing the four-dimensional rotation in part (b).

FIG. 24A to FIG. 24D are block diagrams respectively showing the configuration of receivers 600, 601, 602, and 603 relating to Embodiment 2.

DETAILED DESCRIPTION OF INVENTION

<Examination by the Inventor (1)>

Figure 1:
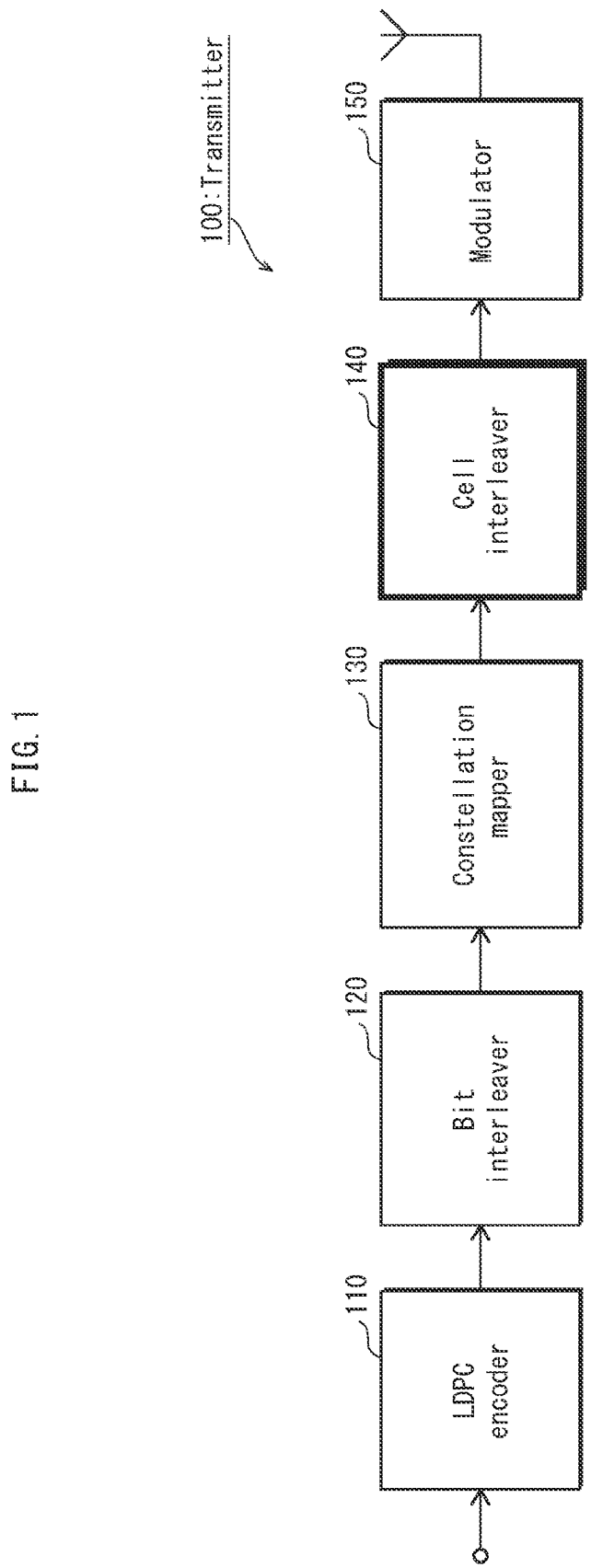
FIG. 1 is a block diagram showing the configuration of a generic transmitter 100.

FIG. 1 is a block diagram showing the configuration of a generic transmitter 100 that employs low-density parity-check (LDPC) codes.

The transmitter 100 includes an LDPC encoder 110, a bit interleaver 120, a constellation mapper 130, a cell interleaver 140, and a modulator 150.

The transmitter 100 receives, as an input, binary blocks of a predetermined length containing information to be transmitted. In the transmitter 100, the LDPC encoder 110 first encodes each information block using an LDPC code (for example, a quasi-cyclic low-density parity check code (QC-LDPC code) including a repeat-accumulate quasi-cyclic low-density parity check code (RA-QC-LDPC code). The encoding processing includes computation of redundancy bits and addition of the redundancy bits to the information block in order to make the reception of the information block by a receiver more robust against errors.

Then, the bit interleaver 120 interleaves a plurality of bits of a codeword obtained by encoding (hereinafter, referred to as a code block) (bit interleaving), and supplies the bit-interleaved bits of the code block to the constellation mapper 130. Note that a codeword obtained by encoding with use of a code other than an LDPC code is also called a code block.

Next, the constellation mapper 130 transforms each of a plurality of groups of the bit-interleaved bits of the code block into a block that is composed of a complex quadrature amplitude modulation symbol (QAM symbol) or a plurality of complex QAM symbols. Real and imaginary components of the complex QAM symbols are modulated independently. The real and the imaginary components are each regarded as a pulse amplitude modulation symbol (PAM symbol) or an amplitude shift keying symbol (ASK symbol).

Note that a complex QAM symbol is also termed a complex cell or a constellation, and a block that is composed of one or more complex QAM symbols is termed a constellation block.

The cell interleaver 140 interleaves a plurality of complex cells, which are supplied by the constellation mapper 130 (cell interleaving).

The modulator 150 transforms the complex cells, which are supplied by the cell interleaver 140, using orthogonal frequency-division multiplexing (OFDM). The transformed complex cells are transmitted on a communication medium.

The following describes some of characteristics of LDPC codes.

LDPC codes are linear error-correcting codes that are fully defined by a parity-check matrix (PCM), which is a binary sparse matrix that represents connection of bits of a codeword (also referred to as variable nodes) to parity checks (also referred to as check nodes). Columns and rows of the PCM correspond to the variable nodes and the check nodes, respectively. Connections of the variable nodes to the check nodes are represented by an element "1" in the PCM.

QC LDPC codes are one variety of LDPC codes. QC-LDPC codes have a structure that is particularly suitable for hardware implementation. In fact, most of not all standards today use QC-LDPC codes. The PCM of such a QC-LDPC code has a special structure consisting of a plurality of circulant matrices (also referred to as circulants). A circulant matrix is a square matrix in which each row is a cyclic shift of an element of the previous row with one position, and can have one, two, or more cyclically-shifted diagonals. The size of each circulant matrix is Q rows and Q columns (Q×Q), where Q is referred to as the cyclic factor of the LDPC code. Such a quasi-cyclic structure allows Q check nodes to be processed in parallel, and therefore QC-LDPC codes are clearly advantageous for an efficient hardware implementation.

Figure 2:
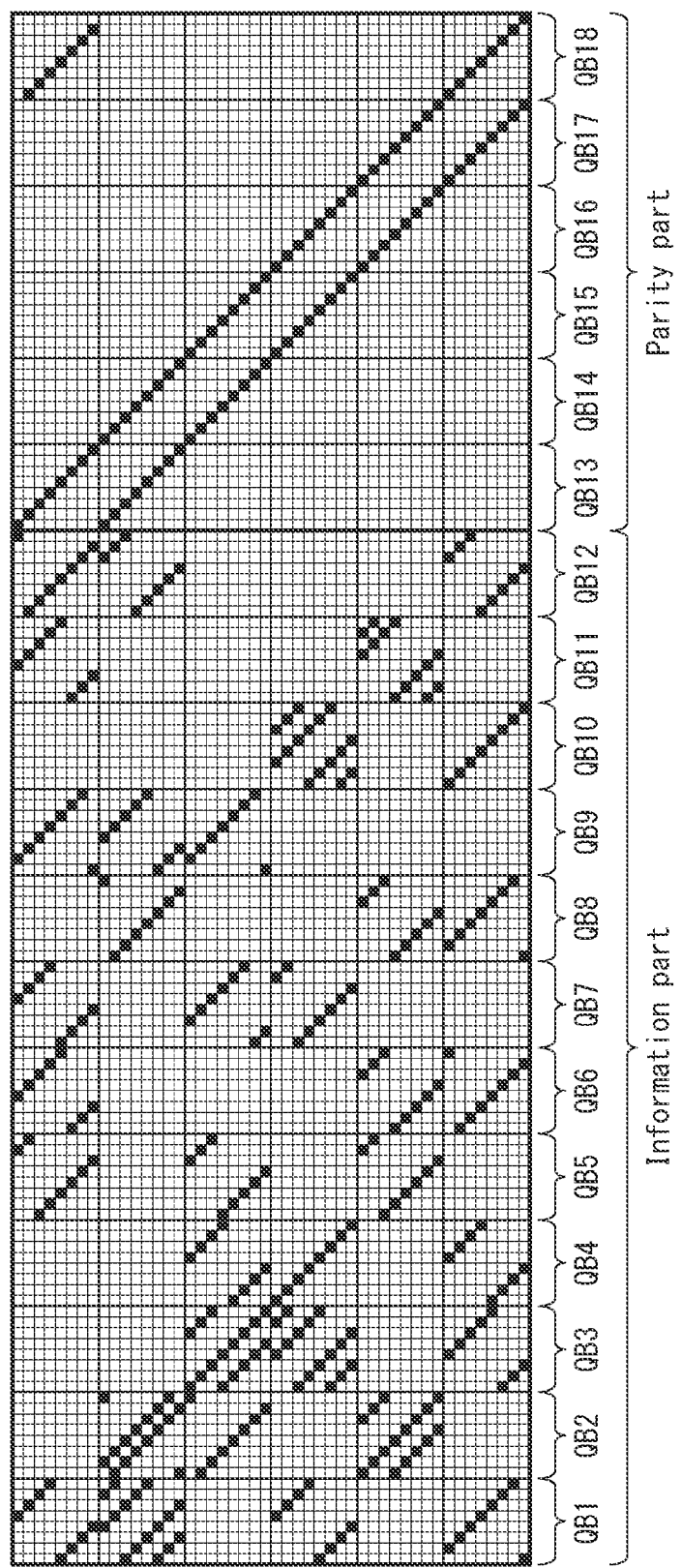
FIG. 2 shows an example of a parity-check matrix (PCM) of a quasi-cyclic low-density parity check code (QC-LDPC code).

FIG. 2 shows an example of a PCM of an LDPC code with a cyclic factor Q=8, the PCM having circulant matrices with one or two cyclically-shifted diagonals. In the PCM in FIG. 2, blackened squares each represent a matrix element having a value of one, and whitened squares each represent a matrix element having a value of zero.

The QC-LDPC code in FIG. 2 is a code for encoding a block of 8×12=96 bits to a codeword of 8×18=144 bits, having therefore a coding rate of $96/144 = 2/3$. The bits of the codeword are divided into blocks of Q bits, which are referred to as cyclic blocks or quasi-cyclic blocks, and denoted by "QB" throughout this document.

The QC-LDPC code of the PCM in FIG. 2 belongs to a special family of QC-LDPC codes that are called RA-QC-LDPC codes. The RA-QC-LDPC codes are well known for their ease of encoding and are encountered in a large number of standards, such as the second-generation DVB standards including the DVB-S2 standard (see Non-Patent Literature 4), the DVB-T2 standard (see Non-Patent Literature 2), and the DVB-C2 standard (see Non-Patent Literature 5). For the RA-QC-LDPC codes, the right-hand side of the PCM, which corresponds to parity bits (parity part), has a staircase structure of the elements "1". These aspects are well known in this technical field. Note that the left-hand side of the PCM corresponds to information bits (information part).

Next, description is given on the bit interleaver 120.

The bit interleaver 120 that realizes an efficient hardware implementation owing to its high degree of parallelism is constructed by dividing a code block into a plurality of sections. Permutation for mapping a plurality of bits of the code block to a plurality of groups of bits is performed separately for each of these sections. Note that one group of bits is mapped by the constellation mapper 130, which is provided on the downstream side, to for example one PAM symbol or one complex QAM symbol.

The bit interleaver 120 first performs processing of dividing N×Q bits of a code block into N/M sections (hereinafter, referred to as a section division). Here, N is the number of QBs per code block, and M is the number of bits per group of bits. Each section consists of M QBs, and each group of bits is associated with a corresponding one of the N/M sections. After the section division, the bit interleaver 120 performs a bit permutation for each section (hereinafter, referred to as a section permutation), such that M bits of each group of bits consist of one bit from each of M different QBs of the corresponding section. The section permutation is applied to each section in accordance with the same rule. As the section permutation, the bit interleaver 120 for example performs processing that is equivalent to column-row interleaving of writing Q×M bits of each section into a matrix with Q columns and M rows row by row (row-wise) and reading out the written bits column by column (column-wise) from the matrix.

Figure 3:
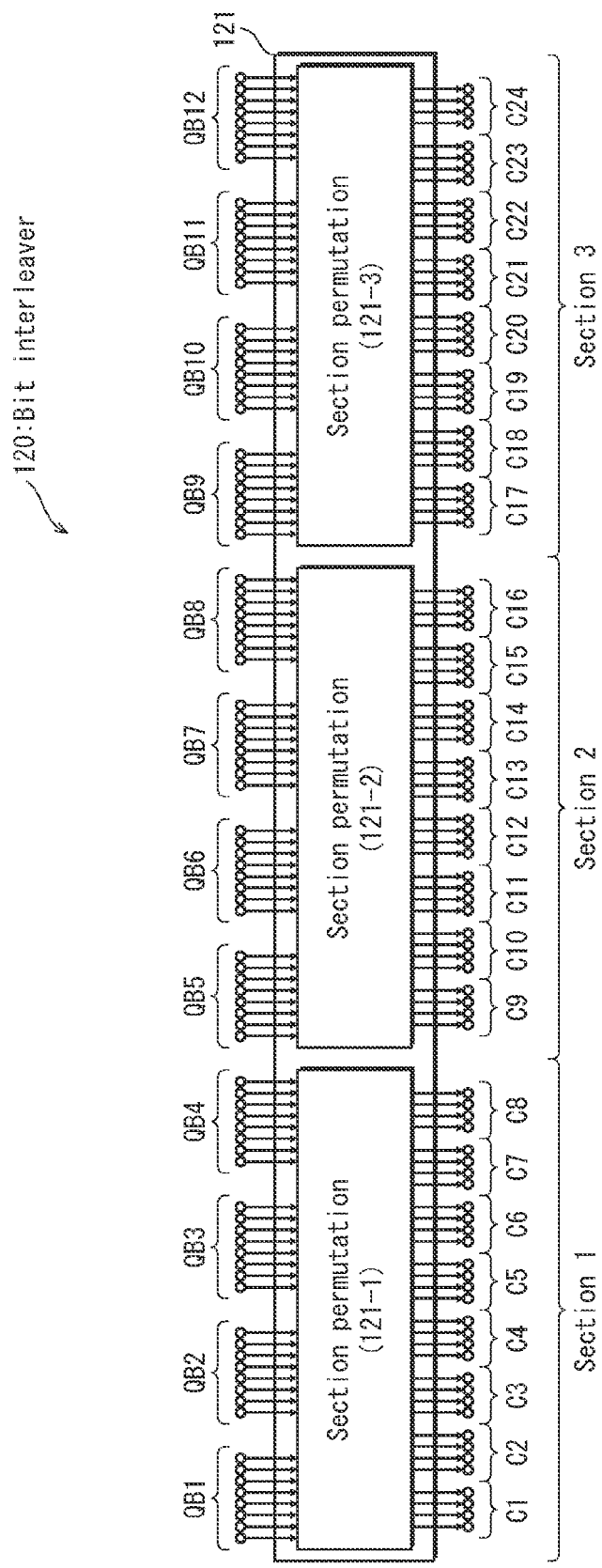
FIG. 3 is a figure explaining the outline of bit interleaving applied by a bit interleaver 120 to bits of a codeword generated based on a quasi-cyclic low-density parity check coding scheme (QC-LDPC coding scheme).

FIG. 3 shows an example of the bit interleaver 120 that is particularly adapted to the structure of a code block using a QC-LDPC code, including a parallel bit interleaver 121 for QC-LDPC codes. The QC-LDPC code in this example has 12 QBs per code block, and eight bits per QB (Q=8). Also, M=4 is satisfied.

In the example in FIG. 3, the bit interleaver 120 performs a section division of dividing 12 QBs QB1 to QB12 into sections, specifically dividing four QBs QB1 to QB4, four QBs QB5 to QB8, and four QBs QB9 to QB12 into sections 1 to 3, respectively. Then, the bit interleaver 120 applies a section permutation to the sections 1 to 3 separately by interleavers 121-1 to 121-3 included in the parallel bit interleaver 121. Note that the section permutation is performed such that one bit of each of M=4 QBs included in the corresponding section is mapped to one of M=4 bits of each of groups of bits C1 to C24.

The following describes an example of a section permutation in the case of M=4 and Q=8 with reference to FIG. 4 targeting the section 1 in FIG. 3.

The section interleaver 121-1 performs a bit interleaving as shown in FIG. 4 such that Q×M=8×4 bits of the QBs QB1 to QB4 are mapped to Q=8 groups of bits C1 to C8 which consist of M=4 bits.

Moreover, further detailed description is given on a section permutation in the case of M=4 and Q=8 with reference to parts (a) and (b) of FIG. 5 targeting the section 1 in FIG. 3. In parts (a) and (b) of FIG. 5, squares each represent one bit of a code block.

The section interleaver 121-1 performs processing equivalent to writing Q×M=8×4 bits of the section 1 row by row into a matrix with Q columns and M rows=eight columns and four rows (section permutation matrix) in the order of input as shown in part (a) in FIG. 5 and reading out the Q×M=8×4 bits column by column from the matrix as shown in part (b) in FIG. 5. Note that the writing order and the reading order are each indicated by an arrow in parts (a) and (b) of FIG. 5, respectively.

Note that the interleaving described with reference to parts (a) and (b) of FIG. 5 is a so-called column-row interleaving.

As a result of the above section permutation, the output of the section interleaver consists of groups of M bits (bits of one column of the matrix), the M bits belonging to M different QBs of the original code block.

Prior to the section division, the order of the QBs in the code block may be changed according to a predefined permutation. This permutation is referred to as a quasi cyclic block permutation (QB permutation). Moreover, the order of the Q bits of each QB may be changed according to a predefined permutation. This permutation is referred to as an intra-quasi-cyclic-block permutation (intra-QB permutation), and is typically a cyclic shift. Although a shift value is typically different for each QB, the shift value may be the same.

Figure 6:
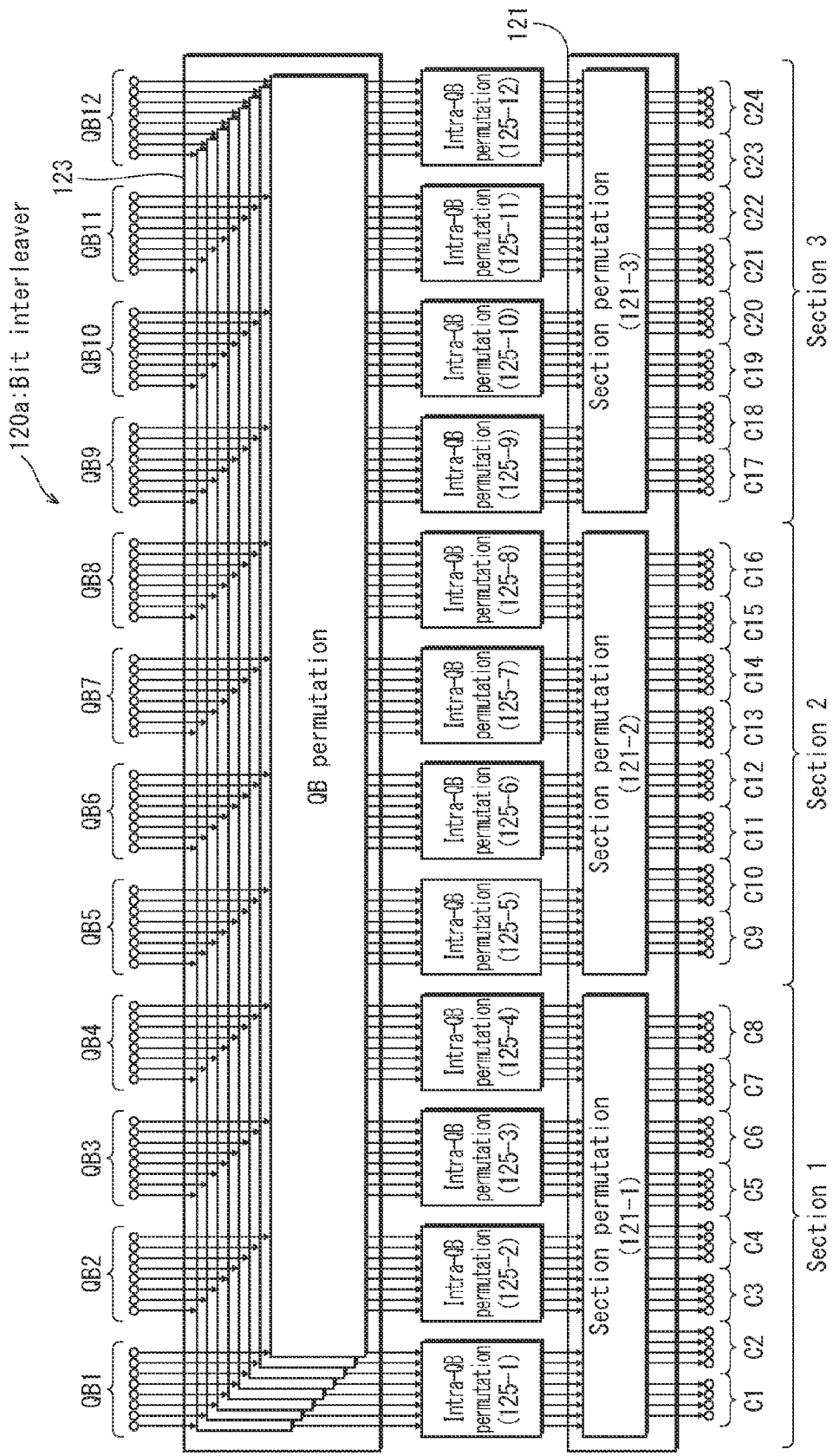
FIG. 6 shows an example of a bit interleaver 120a that is equivalent to the bit interleaver 120 in FIG. 3 to which two types of permutation functions are added.

FIG. 6 shows a configuration example of a bit interleaver having a QB permutation function and an intra-QB permutation function.

The bit interleaver 120a includes, in addition to the section interleaver 121 which performs a section permutation, a QB interleaver 123 that performs QB permutation and intra-QB interleavers 125-1 to 125-12 that perform intra-QB permutation, which are provided before the section interleaver 121.

Note that only one of the QB permutation and the intra-QB permutation may be performed. Alternatively, the QB permutation and the intra-QB permutation may be performed in the inverse order.

While the QB permutation and intra-QB permutation are important for optimization of the communication performance, they are not directly relevant to the present invention. In fact, the QB permutation and intra-QB permutation can be regarded as part of the LDPC code definition. The QB permutation is equivalent to a permutation of the columns of the QB in the original PCM. Also, a cyclic shift in the QB permutation (intra-QB cyclic shift) is equivalent to a cyclic shift of the original cyclic shift of the diagonals in the PCM by further qmodQ, where, q is a shift value for cyclic shift of Q bits in the intra-QB permutation. The same cyclic shift is applied to all diagonals of all QBs in the same column in the PCM.

Next, description is given on the constellation mapper 130.

The constellation mapper 130 maps a plurality of bits of a code block to a complex QAM symbol (constellation) or a block composed of one or more complex QAM symbols (constellation block). The constellation block is also referred to as a modulation block, and refers to a group of bits mapped to one or more complex QAM symbols that are decoded jointly on the receiver side.

First, description is given on the processing performed by the constellation mapper 130 for the QAM constellation, which is the simplest example.

The constellation mapper 130 maps a plurality of bits to a complex QAM symbol (constellation). Real and imaginary components of the complex QAM symbol are modulated independently. The real and the imaginary components are each obtained by encoding a predefined number of bits, and the predetermined number is denoted here by B.

In other words, the constellation mapper 130 maps the bits to PAM symbols B bits by B bits. Then, the constellation mapper 130 outputs a pair of two PAM symbols as a complex QAM symbol. In other words, one of the paired PAM symbols is a real component of the complex QAM symbol, and the other is an imaginary component of the complex QAM symbol.

Figure 7A:
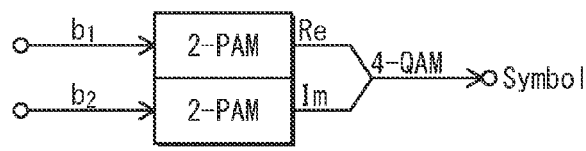
FIG. 7A to FIG. 7C show configuration examples of a constellation mapper 130 employing a complex quadrature amplitude modulation (QAM) constellation.
Figure 7B:
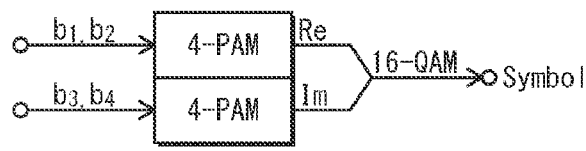
Figure 7C:
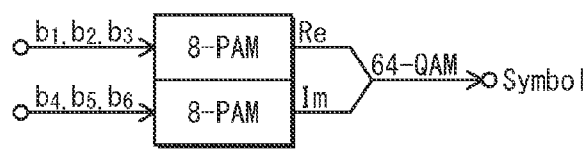

Here, the processing performed by the constellation mapper 130 is further described using examples of three common constellation sizes (4-QAM, 16-QAM, and 64-QAM) with reference to FIG. 7A to FIG. 7C.

As shown in FIG. 7A, in the case where the constellation size is 4-QAM, the constellation mapper 130 maps bits to PAM symbols B=1 bit by B=1 bit to generate a complex QAM symbol corresponding to 2×B=2×1=2 bits.

As shown in FIG. 7B, in the case where the constellation size is 16-QAM, the constellation mapper 130 maps bits to PAM symbols B=2 bits by B=2 bits to generate a complex QAM symbol corresponding to 2×B=2×2=4 bits.

As shown in FIG. 7C, in the case where the constellation size is 64-QAM, the constellation mapper 130 maps bits to PAM symbols B=3 bits by B=3 bits to generate a complex QAM symbol corresponding to 2×B=2×3=6 bits.

A further example of the above constellation blocks can be found in the case of spatial-multiplexing is used in the multiple-input multiple-output communication systems (MIMO communication systems).

According to the MIMO communication systems, a plurality of symbols are transmitted in parallel over a plurality of transmit antennas. In the case where the MIMO communication systems are used, the symbols, which are transmitted over the transmit antennas, need to be decoded jointly on the receiver side in order to ensure the optimal reception performance. Thus, a constellation block is generated on the transmission side. Prior to being modulated and transmitted, the symbols are encoded with an optional code on the transmission side in order to increase the robustness against errors.

Figure 8A:
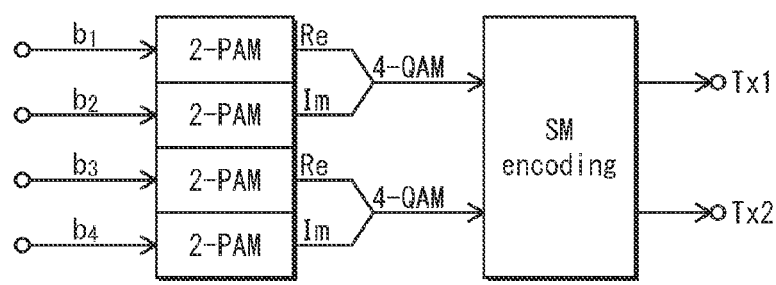
FIG. 8A and FIG. 8B show configuration examples of the constellation mapper 130 employing a multiple-input multiple-output spatial-multiplexing (MIMO-SM).
Figure 8B:
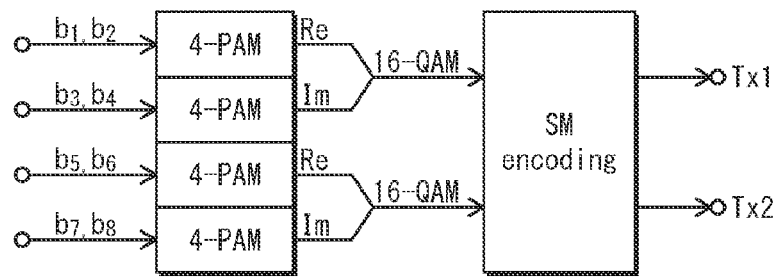

Here, description is given on an example in which when the spatial-multiplexing for the MIMO communication systems is used, a constellation block is generated, with reference to FIG. 8A and FIG. 8B.

As shown in FIG. 8A, in the case where the MIMO-SM is employed, the constellation mapper 130 generates two complex QAM symbols that are to be transmitted in parallel and have the constellation size of 4-QAM, and applies a spatial-multiplexing processing (SM encoding) to the two generated complex QAM symbols to generate a spatial-multiplexing block (constellation block). In the case shown in FIG. 8B, generated complex QAM symbols have the constellation size of 16-QAM.

Note that as shown in FIG. 8A and FIG. 8B, in the case where the constellation mapper 130 performs a spatial-multiplexing processing, a cell interleaving is performed on the downstream side of the constellation mapper 130 for each transmission antenna.

A further another example of the above constellation blocks can be found in the case where a rotation is used.

The rotation is performed in order to increase the robustness in fading channels. The rotation is performed by grouping a plurality of PAM symbols into groups each consisting of D PAM symbols, generating D-dimensional vectors each having D PAM symbols as elements, and multiplying each D-dimensional vector by a square orthogonal matrix with D rows and D columns (D×D square orthogonal matrix). In other words, the rotation is performed by computing a D-dimensional rotated vector $V_R=RV$, where V is a D-dimensional vector, and R is a D×D square orthogonal matrix. A PAM symbol that has undergone the rotation, which is an element of each D-dimensional rotated vector, is hereinafter referred to as a transformed PAM symbol.

The complex QAM symbols (pairs of transformed PAM symbols that are real and imaginary components) obtained by the rotation are regarded as identifying unique points in a D-dimensional space, the resulting $(2^B)^D$ combinations forming a D-dimensional constellation. Accordingly, the above matrix computation is regarded as a rotation in the D-dimensional space, and therefore is referred to as a rotation. A term "rotated constellation" is used as the rotation throughout this document. Only the above particular structure of the D×D square orthogonal matrix (rotation matrix) is not relevant to the present invention.

Preferably, D is a power of 2, such as 2, 4, and 8. Preferably, the number of PAM symbols of each FEC block is a multiple of D.

An orthogonal matrix used in a rotation is for example an orthogonal matrix in which values of elements in each dimension of D-dimensional vectors are spread over at least two dimensions.

Such an orthogonal matrix is for example a matrix in which absolute values of all elements on the main diagonal are equal to the first value, and absolute values of all elements out of the main diagonal are equal to the second value that is not zero, where the main diagonal is a diagonal with i rows and i columns (i=1 to D). Note that the matrix whose D rows are permuted, the matrix whose D columns are permuted, or the matrix whose D rows and D columns are permuted may be used as the orthogonal matrix.

A specific example of this matrix is shown below.

An orthogonal matrix

[Equation 1]

$$R = \begin{pmatrix} s_{1,1}a & s_{1,2}b & \cdots & s_{1,D}b \\ s_{2,1}b & s_{2,2}a & & \vdots \\ \vdots & & \ddots & s_{D-1,D}b \\ s_{D,1}b & \cdots & s_{D,D-1}b & s_{D,D}a \end{pmatrix} \quad \text{(Equation. 1)}$$

satisfies the above Equation 1.

Here, a and b are each a real parameter. A sign value $s_{i,j}$ satisfies the following equation.

[Equation 2]

$$s_{i,j} \in \{-1, +1\} \quad \text{(Equation. 2)}$$

The real parameters a and b satisfy the following equation.

[Equation 3]

$$a^2 + (N-1)b^2 = 1 \quad \text{(Equation. 3)}$$

Here, b≠0.

Note that the structure of the orthogonal matrix used for the rotation is not directly relevant to the inventions relating to Embodiments 1 and 2 which are later described.

In order to ensure the optimal reception performance, D transformed PAM symbols of D-dimensional rotated vectors need to be decoded jointly. A group of D transformed PAM symbols is referred to as a D-dimensional rotated constellation block.

It is desirable that the D transformed PAM symbols of the D-dimensional rotated constellation blocks each should be transmitted in a different one of complex QAM symbols, such that the channel fading is as uncorrelated as possible.

Figure 9:
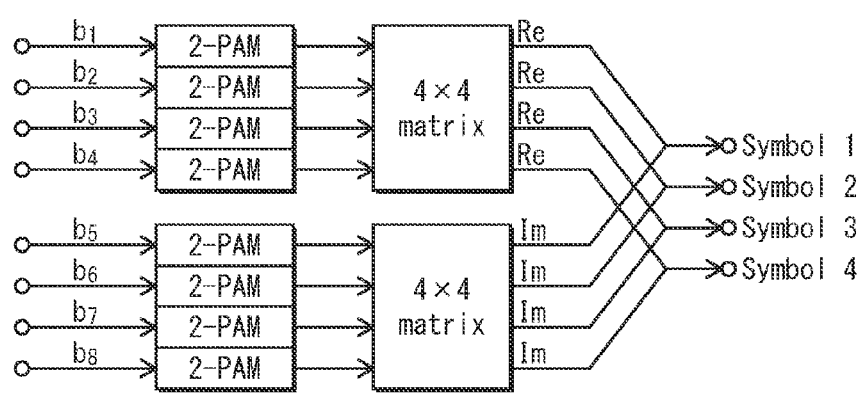
FIG. 9 shows a configuration example of the constellation mapper 130 employing a four-dimensional rotation.

Here, description is given on an example of a constellation block that is generated using rotated constellation, with reference to FIG. 9.

In the case where a four-dimensional rotated constellation (4D-RC) is used, the constellation mapper 130 performs processing (first rotation) of multiplying a four-dimensional vector having four generated PAM symbols with the constellation size of 2-PAM for example as elements by an orthogonal square matrix with four rows and four columns. Similarly, the constellation mapper 130 performs processing (second rotation) of multiplying a four-dimensional vector having four generated PAM symbols with the constellation size of 2-PAM as elements by an orthogonal square matrix with four rows and four columns. Then, the constellation mapper 130 generates a complex QAM symbol by obtaining one of respective results of the first rotation and the second rotation as a real component and obtaining the other as an imaginary component.

Here, the definition of constellation blocks is referred to again.

As described above, a constellation block is a block consisting of one or more complex QAM symbols (or two or more PAM symbols), and is for example a spatial-multiplexing block (SM block), a rotated constellation block, or the like. Also, the description has been given above that one group of bits, which is bit-interleaved by the bit interleaver 120, is mapped to for example one PAM symbol or one complex QAM symbol, and one group of bits consists of M bits.

In other words, a parameter M is chosen to be a divisor of the number of bits constituting a constellation block. For example, M=B may be satisfied, that is, M may be the number of bits per PAM symbol. Alternatively, M=2×B may be satisfied, that is, M may be the number of bits per complex QAM symbol. Each constellation block therefore is regarded as a block that consists of one or more groups that each consist of M bits. Hereinafter, the number of such groups is denoted by G. That is, each constellation block is a block that consists of M×G bits.

Also, the bit interleaver 120 performs a section permutation such that M bits of each group of bits consist of one bit from each of M different QBs, as described above. Accordingly, the following equation is satisfied: the number of constellation blocks per section in the bit interleaver 120= (the number of bits per section)÷(the number of bits per constellation block)=(Q×M)÷(M×G)=Q/G.

That is, output from the constellation mapper 130 is grouped to groups that each consist of Q/G constellation blocks. It is also assumed that G is a divisor of Q.

Figure 10:
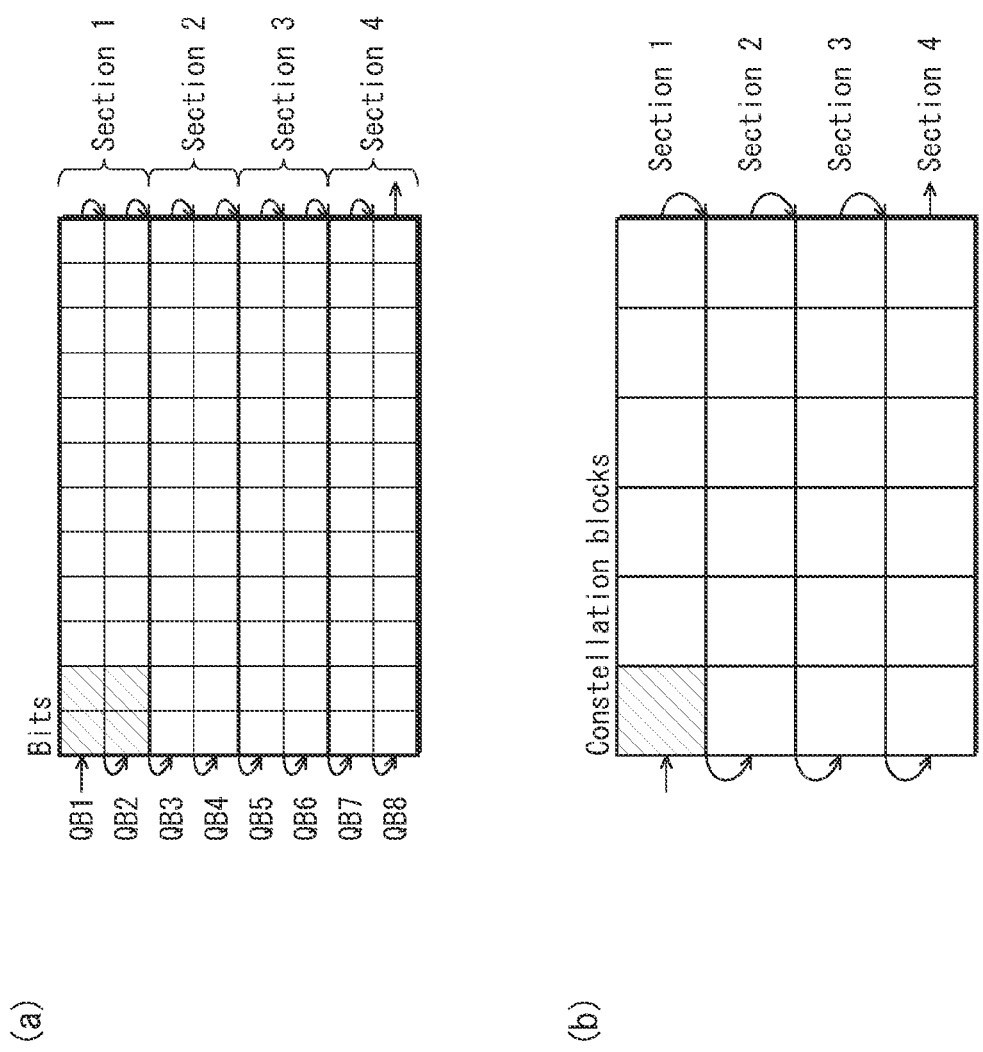
FIG. 10 shows an example of input of bits of a code block to a bit interleaver 120 in part (a), and an example of output from the constellation mapper 130 in part (b).

FIG. 10 shows an example of input of bits of a code block to the bit interleaver 120 in part (a) and an example of output from the constellation mapper 130 in part (b). In parts (a) and (b) of FIG. 10, parameters satisfy Q=12, M=2, and G=2, and sections 1 to 4 each consist of Q/G=6 constellation blocks that each consist of block M×G=2×2=4 bits. Note that four bits that are hatched in part (a) of FIG. 10 constitute one constellation block that is hatched in part (b) of FIG. 10.

As shown in parts (a) and (b) of FIG. 10, since the bit interleaver 120 performs processing in accordance with constellation blocks generated by the constellation mapper 130, the constellation blocks output from the constellation mapper 130 are divided into sections in section division performed by the bit interleaver 120.

Note that the above output processing performed by the bit interleaver 120 may be performed in units of constellation blocks.

If the constellation blocks were transmitted in the order of generation, burst errors would influence only a limited number of QBs. In the DVB-T2 standard for example, the LDPC code includes 45 or 180 QBs. Since not all QBs have the same importance in decoding of code blocks, degradation of the reception performance depends on which QBs are influenced by burst errors, in other words, depends on the occurrence position of the burst errors.

It is known that permutation of the order of the constellation blocks prior to transmission is effective for reducing degradation of the reception performance due to the burst errors.

The cell interleaver 140 applies permutation to the complex cells which are supplied by the constellation mapper 130. As a result of the permutation applied to the complex cells, the order of the constellation blocks is changed. Therefore, it is possible to reduce degradation of the reception performance due to the burst errors.

The solution adopted in the DVB-T2 standard (see Non-Patent Literature 2) and subsequently in the upcoming DVB-NGH standard (see Non-Patent Literature 1) is to apply a pseudo-random permutation, such that burst errors are randomly spread over the code block as processing performed by the cell interleaver 140. In both the DVB-T2 standard and the upcoming DVB-NGH standard, the pseudo-random permutation is performed using a linear feedback shift register (LFSR). Moreover, the pseudo-random permutation is different for each code block for additional randomization.

It is clear that the pseudo-random permutation performed by the cell interleaver 140 improves the reception performance. However, such pseudo-random permutation is processing of pseudo-randomly permuting the cells as the name suggests, and the reception performance still depends on which QBs are influenced by the burst errors. Moreover, these reception performance are not the same for all code blocks since each code block uses a different cell permutation.

The inventor has discovered that it is possible to reduce degradation of the reception performance due to the burst errors and equalize the reception performance on code blocks, by performing a permutation of spreading constellation blocks over a code block corresponding to a section division performed by a functional block instead of performing a pseudo-random permutation by the cell interleaver 140. (Note that the same column-row interleaver may be applied to all code blocks).

Embodiment 1 describes a transmitter based on the above discovery.

<Embodiment 1>
<Transmitter and Transmission Method>

Figure 11:
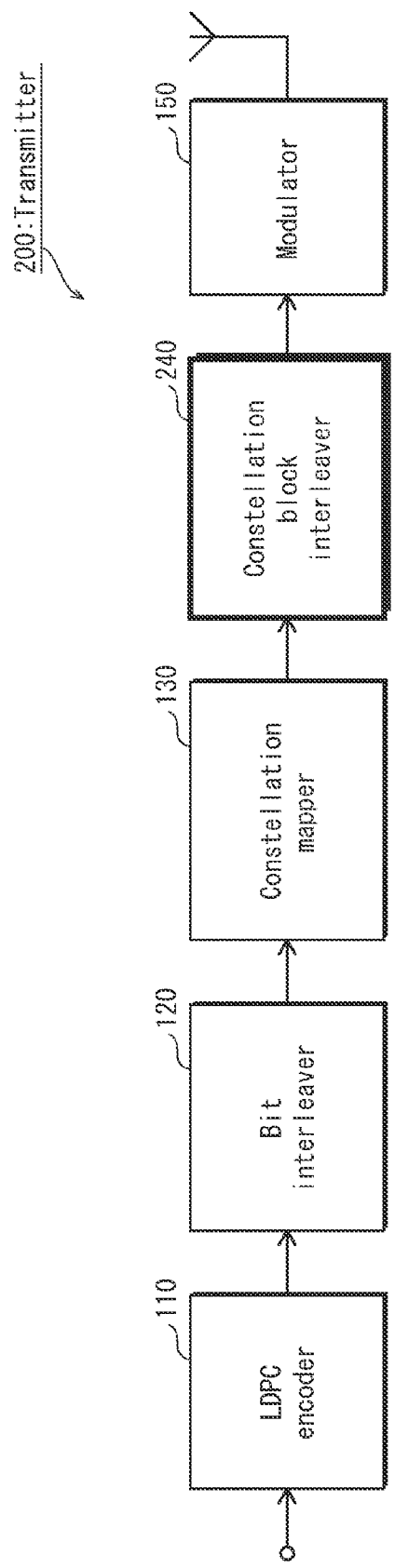
FIG. 11 is a block diagram showing the configuration of a transmitter 200 relating to Embodiment 1.

FIG. 11 is a block diagram showing the configuration of a transmitter 200 relating to Embodiment 1 of the present invention. In Embodiment 1, the same reference signs are used and description is omitted for constituent elements to which applies the description of the constituent elements of the transmitter 100 in FIG. 1 as described in the section <Examination by the Inventor (1)>.

The transmitter 200 in FIG. 11 is equivalent to the transmitter 100 in FIG. 1 in which the cell interleaver 140 is replaced with a constellation block interleaver 240.

The constellation block interleaver 240 performs, with respect to each of supplied code blocks, processing that is equivalent to writing S×(Q/G) constellation blocks row by row into a matrix with S rows and Q/G columns (constellation block permutation matrix) and reading out the written constellation blocks column by column from the matrix (constellation block interleaving). Here, S=N/M is satisfied, in other words, S is the number of sections in the section division on the upstream side. Note that the constellation block indicates, for example, a complex QAM symbol, a spatial multiplexing block, and a rotated constellation block.

FIG. 12 shows in parts (a) and (b) examples of processing performed by the constellation block interleaver 240. In parts (a) and (b) of FIG. 12, parameters satisfy S=4 and Q/G=8, squares each represent a constellation block. The number appended to each constellation block is an index number of a section having the constellation block as an element.

Here, the constellation block interleaver 240 for example writes 4×8 constellation blocks row by row into a matrix with four rows and eight columns in the order of input as shown in part (a) in FIG. 12, and reads out the written constellation blocks column by column from the matrix as shown in part (b) in FIG. 12. Note that the writing order and the reading order are each indicated by an arrow in parts (a) and (b) of FIG. 12, respectively.

As shown in parts (a) and (b) of FIG. 12, the constellation blocks are written into each row for each section, and the written constellation blocks are read out from each column, and as a result the constellation blocks which constitute each section are equally spread over the code block. According to the constellation block interleaver 240, the influence of the burst errors does not concentrate on constellation blocks of part of the sections, and is spread over all the sections. In other words, the influence of the burst errors does not concentrate on QBs of part of the code block, and is equally spread over all the QBs. This reduces degradation of the reception performance due to the influence of the burst errors.

Note that the processing performed by the constellation block interleaver 240 may be modified as described below.

The constellation block interleaver 240 may perform, with respect to each of supplied code blocks, processing equivalent to writing (N×Q)/(G×M) constellation blocks row by row into a matrix with R rows and {((N×Q)/(G×M))/R} columns in the order of input (constellation permutation matrix) and reading out the written constellation blocks column by column from the matrix. Here, R is a multiple of the number of sections S=N/M per code block, preferably R=2S or R=4S is satisfied. In other words, the number of columns in the interleaver matrix is a divisor of the number of constellation blocks per section.

FIG. 13 shows in parts (a) and (b) examples of processing performed by the constellation block interleaver 240 relating to the present modification. In parts (a) and (b) of FIG. 13, parameters satisfy R=2, S=4, and Q/G=8, squares each represent a constellation block like in part (a) of FIG. 12. The number appended to each constellation block is an index number of a section having the constellation block as an element.

In this case, the constellation block interleaver 240 for example writes 8×4 constellation blocks row by row into a matrix with eight rows and four columns in the order of input as shown in part (a) in FIG. 13, and reads out the written constellation blocks column by column from the matrix as shown in part (b) in FIG. 13. Note that the writing order and the reading order are each indicated by an arrow in parts (a) and (b) of FIG. 13, respectively.

To summarize, the constellation block interleaver 240 performs, with respect to each of supplied code blocks, processing equivalent to writing (R×(Q/(k×G)) constellation blocks row by row into a matrix R rows and Q/(k×G) columns in the order of input and reading out the written constellation blocks column by column from the matrix, where R is k×(N/M), and k is a positive integer.

According to the transmitter relating to Embodiment 1, since constellation blocks are spread over a code block for transmission, it is possible to reduce influence of burst errors and equalize the reception performance on code blocks, thereby improving the reception performance in the communication systems.

<Receiver and Reception Method>

Figure 14:
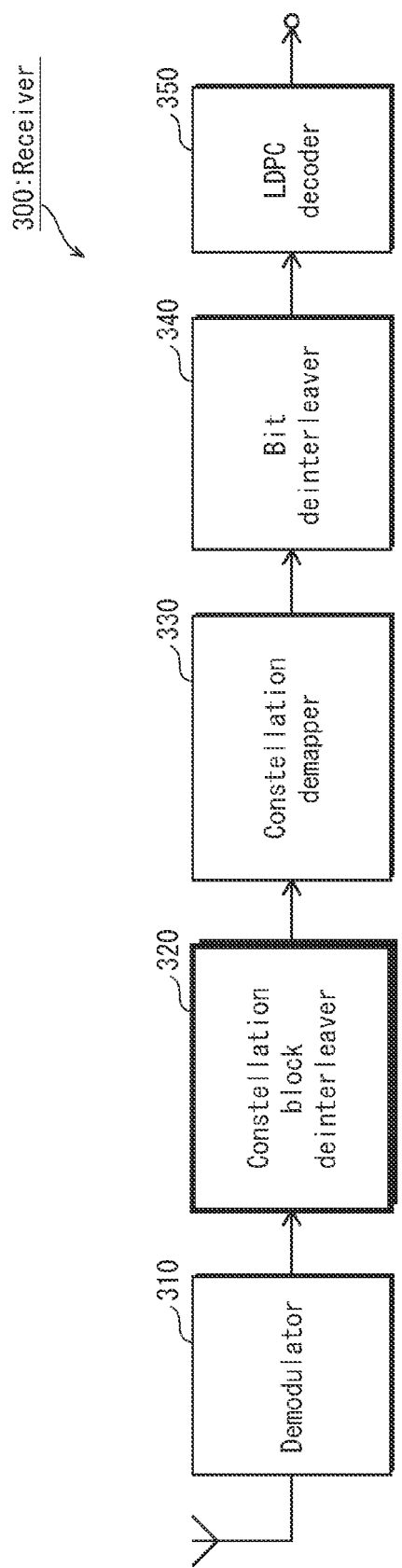
FIG. 14 is a block diagram showing the configuration of a receiver 300 relating to Embodiment 1.

FIG. 14 is a block diagram showing the configuration of a receiver 300 relating to Embodiment 1 of the present invention. The receiver 300 in FIG. 14 corresponds to the transmitter 200 in FIG. 11, and mirrors the functionality of the transmitter 200.

The receiver 300 includes a demodulator 310, a constellation block deinterleaver 320, a constellation demapper 330, a bit deinterleaver 340, and an LDPC decoder 350.

In the receiver 300, a signal, which is received by a receive antenna, is first processed by a radio-frequency (RF) frontend (not shown), typically including a tuner and a down-converter, then by the demodulator 310.

Upon receiving a digital baseband signal from the RF frontend, the demodulator 310 demodulates the received digital baseband signal. In other words, the demodulator 310 computes channel fading coefficients based on the digital baseband signal to generate constellation blocks. The generated constellation blocks each consist of one or more complex symbols.

In order to restore the order of the complex cells to the order before an interleaving performed by the constellation block interleaver 240 included in the transmitter 200, the constellation block deinterleaver 320 applies, to the constellation blocks supplied from the demodulator 310, a permutation that is the inverse of the permutation performed by the constellation block interleaver 240 (constellation block deinterleaving).

Assume the case where the constellation block interleaver 240 included in the transmitter 200 performs, with respect to of each of supplied code blocks, processing equivalent to writing (R×Q/(k×G)) constellation blocks row by row into a matrix with R rows and Q/(k×G) columns (constellation block permutation matrix) in the order of input and reading out the written constellation blocks column by column from the matrix. In this case, the constellation block deinterleaver 320 performs, with respect to of each of the code blocks, processing equivalent to writing (R×Q/(k×G)) constellation blocks column by column into a matrix with R rows and Q/(k×G) columns (constellation block permutation matrix) in the order of input and reading out the written constellation blocks row by row from the matrix. Note that the constellation permutation matrix used by the constellation block deinterleaver 320 has the same structure as the constellation permutation matrix used by the constellation block interleaver 240 included in the transmitter 200.

Next, the constellation demapper 330 extracts LDPC encoded (soft) bits from each of the constellation blocks output from the constellation block deinterleaver 320. This bit extraction method is well known in this technical field.

In order to restore the order of the (soft) bits to the order before an interleaving performed by the bit interleaver 120 included in the transmitter 200, the bit deinterleaver 340 bit-deinterleaves the (soft) bits supplied by the constellation demapper 330.

Specifically, the bit deinterleaver 340 first divides bits of the supplied code block in accordance with the same rule as the rule used in the section division performed by the bit interleaver 120. In other words, the bit deinterleaver 340 divides the supplied N×Q bits into N/M sections. Then, the bit deinterleaver 340 applies bit-interleaving for each N/M sections in accordance with the rule that is the inverse of the rule used in the section permutation performed by the bit interleaver 120 (section deinterleaving). In other words, the bit deinterleaver 340 performs processing equivalent to writing Q×M bits of each of the sections column by column into a matrix with Q columns and M rows (section permutation matrix) and reading out the written bits row by row from the matrix. Note that the section permutation matrix used by the bit deinterleaver 340 has the same structure as the section permutation matrix used by the bit interleaver 120 included in the transmitter 200.

Note that the bit interleaver 120 included in the transmitter 200 may additionally have a function of performing a QB permutation and/or an intra-QB permutation prior to the section interleaving (see FIG. 6). In this case, the bit deinterleaver 340 should additionally have a function of performing interleaving subsequent to the section deinterleaving in accordance with a rule that is the inverse of the rule used in the intra-QB permutation and/or the QB permutation.

Next, the LDPC decoder 350 applies, to the (soft) bits output from the bit deinterleaver 340, LDPC decoding based on the same LDPC code used by the LDPC encoder 110 included in the transmitter 200. This decoding method is well known in this technical field.

The above description has been given on the transmission method that improves the reception performance by including, in the transmitter, the constellation block interleaver that performs constellation block permutation corresponding to section division of code blocks on the upstream side. The following describes a transmission method that improves the reception performance in the case where rotated constellation is performed, from a different viewpoint.

<Examination by the Inventor (2)>

First, description is given on a generic transmission art employing a rotated constellation, with reference to the drawings. In this description, the same reference signs are used and description is omitted for constituent elements to which applies the description of the constituent elements of the transmitter 100 (FIG. 1) and the transmitter 200 (FIG. 11) described above.

FIG. 15A to FIG. 15D are block diagrams respectively showing the configuration of generic transmitters 400, 401, 402, and 403 that employ rotated constellation.

The transmitter 400 in FIG. 15A includes an FEC encoder 410, a QAM mapper 420, a rotator 450, a component separator 460, and a modulator 490.

The transmitter 400 receives, as an input, binary blocks of a predetermined length containing information to be transmitted. In the transmitter 400, the FEC encoder 410 first encodes each information block using an FEC code. The encoding processing includes computation of redundancy bits and addition of the redundancy bits to the information block in order to make the reception of the information block by a receiver more robust against errors. (Note that the above LDPC codes are one type of FEC codes, and the LDPC encoder 110 may be used as the FEC encoder 410).

A bit interleaver (not shown) interleaves bits of the code block, and supplies the bit-interleaved code block to the QAM mapper 420.

The QAM mapper 420 maps the bits of the supplied code block to complex QAM symbols. Complex QAM symbols each consist of one real component and one imaginary component. The QAM mapper 420 allocates each B bits of a plurality of bits to each component. The mapping of complex QAM symbols performed by the QAM mapper 420 is equivalent to the mapping of complex QAM symbols performed by the constellation mapper 130 in Embodiment 1 described above.

The rotator 450 performs the rotation of the complex QAM symbols generated by the QAM mapper 420 in order to introduce a dependence between the real and the imaginary components, in other words, in order to allow the reception side to decode one of the real and the imaginary components. This rotation increases the robustness of the communication systems in channels with deep fading and disappearance.

The rotator 450 for example groups a plurality of components (PAM symbols) into groups each consisting of two components, generates two-dimensional vectors each having two components as elements, and applies two-dimensional rotation by multiplying each two-dimensional vector by a square orthogonal matrix with two rows and two columns (2×2 square orthogonal matrix).

The rotation performed by the rotator 450 is not limited to this two-dimensional rotation, and may be extended to more than two dimensions as described in Embodiment 1.

The rotator 450 may group a plurality of components into groups each consisting of D components, generates D-dimensional vectors each having D components as elements, and apply D-dimensional rotation by multiplying each D-dimensional vector by a square orthogonal matrix with D rows and D columns (D×D square orthogonal matrix). Hereinafter, a D-dimensional rotated constellation block obtained by the D-dimensional rotation is denoted by "CB".

In order to achieve effective performance with rotated constellations, the channel fading that influences the D components of each D-dimensional rotated constellation block needs to be as uncorrelated as possible.

The component separator 460 performs processing for separating D components as far as possible in time and frequency (hereinafter, referred to as processing for component separation).

The modulator 490 transforms complex cells processed by the component separator 460 into transmission signals. In the DVB-T2 standard, an OFDM modulation is for example adopted as modulation means in order to increase the diversity in the communication systems. Note that a time interleaving and a frequency interleaving may be applied to the complex cells prior to transformation into the transmission signals.

There are solutions for processing for component separation known in the art. One of the solutions is the rotated-constellation scheme specified by the DVB-T2 standard (see Non-Patent Literature 2), and an improvement thereof is described in the upcoming DVB-NGH standard (see Non-Patent Literature 1).

The DVB-T2 standard is a television standard presenting improvements over the DVB-T standard (see Non-Patent Literature 3), and describes a second-generation transmission system for terrestrial digital television broadcasting. The DVB-T2 standard describes a channel coding and modulation system for transmitting digital television services and generic data.

FIG. 15B is a block diagram showing the configuration of the transmitter 401 based on the DVB-T2 standard. The diagram in FIG. 15B is simplified to include only blocks that are relevant to the present invention.

The transmitter 401 is equivalent to the transmitter 400 in which the FEC encoder 410 is replaced with an LDPC encoder 110, the component separator 460 is excluded, and a Q delay inserter 465 and a cell interleaver 480 are provided after the rotator 450. Note that the DVB-T2 standard supports the case where an LDPC code is employed as the FEC code and a two-dimensional rotation is employed as rotation in the communication systems.

Since a rule for rotation performed by the rotator 450 included in the transmitter 401 is greatly relevant to processing for component separation, description is given first on the rule for rotation performed by the rotator 450 with reference to parts (a) and (b) of FIG. 16.

FIG. 16 shows examples of output from the rotator 450 employing a two-dimensional constellation (2D-RC) and a 4D-RC in parts (a) and (b), respectively. In parts (a) and (b) of FIG. 16, squares each represent a component of the rotated constellation. Columns each represent a complex cell with a pair of real and imaginary components. The upper column represents one of the real and the imaginary components, and the lower column represents the other. Outline squares each represent a code block that consists of twelve complex cells in parts (a) and (b) of FIG. 16. The number appended to each component is an index number of a rotated constellation block having the component as an element. The same definitions apply to parts (c) and (d) of FIG. 16 which are later described.

The rotator 450 included in the transmitter 401 applies rotation to D-dimensional vectors having D/2 real and D/2 imaginary components as elements.

As shown in part (a) in FIG. 16, 2D-RC blocks each consist of two components, namely, one real component and one imaginary component. Also, as shown in part (b) in FIG. 16, 4D-RC blocks each consist of four components, namely, two real components and two imaginary components.

In the transmitter 401, processing for component separation is performed by the Q delay inserter 465 and the cell interleaver 480.

The Q delay inserter 465 delays one of the real and the imaginary components of each complex cell of each code block by D/2 complex cells. Complex cells output from the Q delay inserter 465 each consist of real and imaginary components that are each from a different one of rotated constellation blocks.

The term "Q-delay" is used because the Q delay inserter 465 delays one of the real and the imaginary components of the code block, which are in quadrature relative to each other, by D/2 complex cells.

FIG. 16 shows examples of processing performed by the Q delay inserter 465 employing a 2D-RC and a 4D-RC in parts (c) and (d), respectively. Parts (c) and (d) of FIG. 16 correspond to parts (a) and (b) of FIG. 16, respectively.

As shown in part (c) of FIG. 16, in the case where a 2D-RC is employed, the Q delay inserter 465 applies a relative delay of D/2=2/2=1 complex cells between real and imaginary components. Also, as shown in part (d) of FIG. 16, in the case where a 4D-RC is employed, the Q delay inserter 465 applies a relative delay of D/2=4/2=2 complex cells between real and imaginary components.

The cell interleaver 480 permutes a plurality of complex cells which result from the processing performed by the Q delay inserter 465. In the DVB-T2 standard, as the cell interleaver 480, a pseudo-random cell interleaver is adopted that performs pseudo-random permutation generated with an LFSR.

The cell interleaver 480 is provided in the transmitter 401 based on the DVB-T2 standard for performing two functions.

The first function is to spread the influence of the burst errors that occur in the channel as irregularly as possible throughout a code block. The second function is to spread D components of each D-dimensional rotated-constellation block in time and frequency. This second function is relevant only for the case where a rotation is employed.

Since a pseudo-random cell interleaver is used as the cell interleaver 480, the first function is achieved to a certain degree. Unfortunately, such a pseudo-random cell interleaver performs pseudo-random permutation as the name suggests, and this results in insufficient separation of D components of each D-dimensional rotated constellation block. As a result, effective performance with rotated constellations is not achieved in channels with deep fading and disappearance, and it is impossible to reduce degradation of the reception performance.

The second function is achieved by replacing the pseudo-random cell interleaver with a component interleaver that performs permutation suitable for spreading D components of each D-dimensional rotated constellation block. However, the pseudo-random cell interleaver has a structure provided in the transmitter 401 for achieving the first function. Accordingly, if the pseudo-random cell interleaver is replaced with the component interleaver, which is an interleaver for achieving the second function, the first function is not sufficiently achieved, namely, the influence of the burst errors is not sufficiently spread over the code block.

In order to simultaneously achieve both the first function and the second function, a method is applicable according to which both the cell interleaver 480 and the above component interleaver for achieving the second function are provided in the transmitter.

FIG. 15C is a block diagram showing the configuration of the transmitter 402 based on this idea.

The transmitter 402 is equivalent to the transmitter 401 in which a cell interleaver 480 is provided after the QAM mapper 420, and a component interleaver 470 is provided after the Q delay inserter 465.

The transmitter 402 includes the cell interleaver 480 for achieving the first function and the component interleaver 470 for achieving the second function.

The component interleaver 470 for example applies permutation suitable for spreading D components of each D-dimensional rotated constellation block to complex cells supplied by the Q delay inserter 465. Specifically, the component interleaver 470 for example performs, with respect to each of supplied code blocks, processing equivalent to writing D×X complex cells column by column into a matrix with D rows and X columns (component permutation matrix) in the order of input and reading out the written complex cells row by row from the matrix. Here, X is a quotient obtained by dividing the number of complex cells constituting the code block by D.

FIG. 17 shows examples of processing performed by the component interleaver 470 employing a 2D-RC in parts (a) and (b), respectively. FIG. 18 shows examples of processing performed by the component interleaver 470 employing a 4D-RC in parts (a) and (b), respectively. Squares each represent a complex cell.

In the case where a 2D-RC is employed (D=2), the component interleaver 470 for example writes 2×6 complex cells column by column into a matrix with two rows and six columns in the order of input as shown in part (a) in FIG. 17, and reads out the written complex cells row by row from the matrix as shown in part (b) in FIG. 17. Note that the writing order and the reading order are each indicated by an arrow in parts (a) and (b) of FIG. 17, respectively.

In the case where a 4D-RC is employed (D=4), the component interleaver 470 for example writes 4×3 complex cells column by column into a matrix with four rows and three columns in the order of input as shown in part (a) in FIG. 18, and reads out the written complex cells row by row from the matrix as shown in part (b) in FIG. 18. Note that the writing order and the reading order are each indicated by an arrow in parts (a) and (b) of FIG. 18, respectively.

The processing for component separation performed by the transmitter 402 is composed of the following processing steps (1) to (3).

(1) Rotation is applied to each D-dimensional vector having D/2 real and D/2 imaginary components as elements in a code block (the rotator 450).

(2) A relative delay of at least D/2 cells is applied between the real and the imaginary components such that the D components of each D-dimensional rotated constellation block, which are generated in the processing step (1), are allocated to different D complex cells (the Q delay inserter 465).

(3) A permutation is applied to the complex cells of the code block, which have undergone the processing step (2), such that the D complex cells to which the D components are allocated are spread over the code block (the component interleaver 470). This is equivalent to that the same permutation is applied to the real and the imaginary components.

Note that the processing for component separation is not limited to the above processing. In the upcoming DVB-NGH standard (see Non-Patent Literature 1) for example, the processing for component separation is processing that is performed in the combined steps (2) and (3) subsequent to the step (1). Since the relative delay can be regarded as a permutation, different permutations are specifically applied to the real and the imaginary components. For the purpose of the present invention, the definition of the component interleaver is extended to include the Q-delay. In other words, the terms component interleaving and component separation are used interchangeably.

FIG. 15D shows the configuration of the transmitter 403 that performs component separation processing by a method different from the method of the above transmitter 402 (FIG. 15C).

The transmitter 403 is equivalent to the transmitter 402 in which the Q delay inserter 465 is excluded.

The above description has been given that, in the transmitter 402, D components of each of D-dimensional rotated constellation blocks are each allocated to a different one of complex cells by the Q delay inserter 465 performing the above step (2). In the transmitter 403 compared with this, the rotator 450 separately applies a rotation to real and imaginary components in accordance with a rule for rotation performed by the rotator 450 such that complex cells each consist of real and imaginary components that are each from a different one of rotated constellation blocks.

Figure 19:
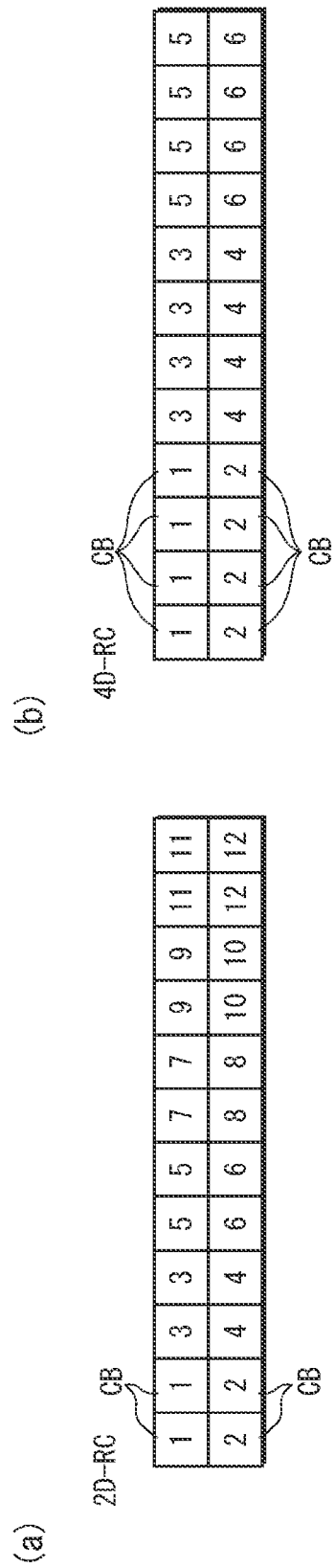
FIG. 19 shows an example of output from a rotator 450 included in a transmitter 403 employing a two-dimensional rotation in part (a), and an example of output from the rotator 450 included in the transmitter 403 employing the four-dimensional rotation in part (b).

Description is given on the rule for rotation performed by the rotator 450 included in the transmitter 403, with reference to parts (a) and (b) of FIG. 19.

FIG. 19 shows examples of output from the rotator 450 included in the transmitter 403 employing a 2D-RC and a 4D-RC in parts (a) and (b), respectively. In parts (a) and (b) of FIG. 19, squares each represent a component of the rotated constellation. Columns each represent a complex cell with a pair of real and imaginary components. The upper column represents one of the real and the imaginary components, and the lower column represents the other. Outline squares each represent a code block that consists of twelve complex cells in parts (a) and (b) of FIG. 19. The number appended to each constellation component is an index number of a rotated constellation block having the component as an element.

The rotator 450 separately applies a rotation to D real and D imaginary components. Specifically, the rotator 450 applies a first rotation to each of D-dimensional vectors each having D real components as elements, and applies a second rotation to each of D-dimensional vectors each having D imaginary components as elements.

As shown in part (a) of FIG. 19, 2D-RC blocks each consist of two real components or two imaginary components. Also, as shown in part (b) of FIG. 19, 4D-RC blocks each consist of four real components or four imaginary components.

In this way, complex cells output from the rotator 450 included in the transmitter 403 each automatically consist of real and imaginary components that are each from a different one of rotated constellation blocks. Accordingly, it is not necessary to provide the configuration for allocating D components of each rotated constellation block to different complex cells like the configuration of the Q delay inserter 465 included in the transmitter 402.

The processing for component separation performed by the transmitter 403 is composed of the following processing steps (1A) and (2B).

(1A) A first rotation is applied to one type of D-dimensional vectors having D real components as elements and D-dimensional vectors having D imaginary components as elements, and a second rotation is applied to the other type (the rotator 450).

(2A) A permutation is applied to complex cells of the code block, which are obtained by the processing step (1A), such that the D complex cells each having components allocated thereto are spread over the code block (the component interleaver 470). Note that the processing step (2A) is the same as the processing step (3) performed by the transmitter 402.

However, the transmitters 402 and 403 each have the configuration for performing a component separation on the downstream side of the cell interleaver 480 (the transmitter 402 includes the Q delay inserter 465 and the component interleaver 470, and the transmitter 403 includes the component interleaver 470). For this reason, the order of the complex cells, which are permuted by the cell interleaver 480, is disturbed, and this results in insufficient spread of the influence of the burst errors over the code block.

Accordingly, the inventor has discovered that the transmitter should include, on the upstream side of the rotator, a component deinterleaver that performs a permutation that is the inverse of the permutation performed by the component interleaver, such that processing for component separation is performed while the order of the complex cells, which are permuted by the cell interleaver 480, is maintained.

Embodiment 2 describes a transmitter and a receiver based on the above discovery.

<Embodiment 2>

<Transmitter and Transmission Method>

FIG. 20A to FIG. 20D are block diagrams respectively showing the configuration of transmitters 500, 501, 502, and 503 relating to Embodiment 2 of the present invention. In Embodiment 2, the same reference signs are used and description is omitted for constituent elements to which applies the description of the constituent elements of the transmitter described above.

Figure 20:
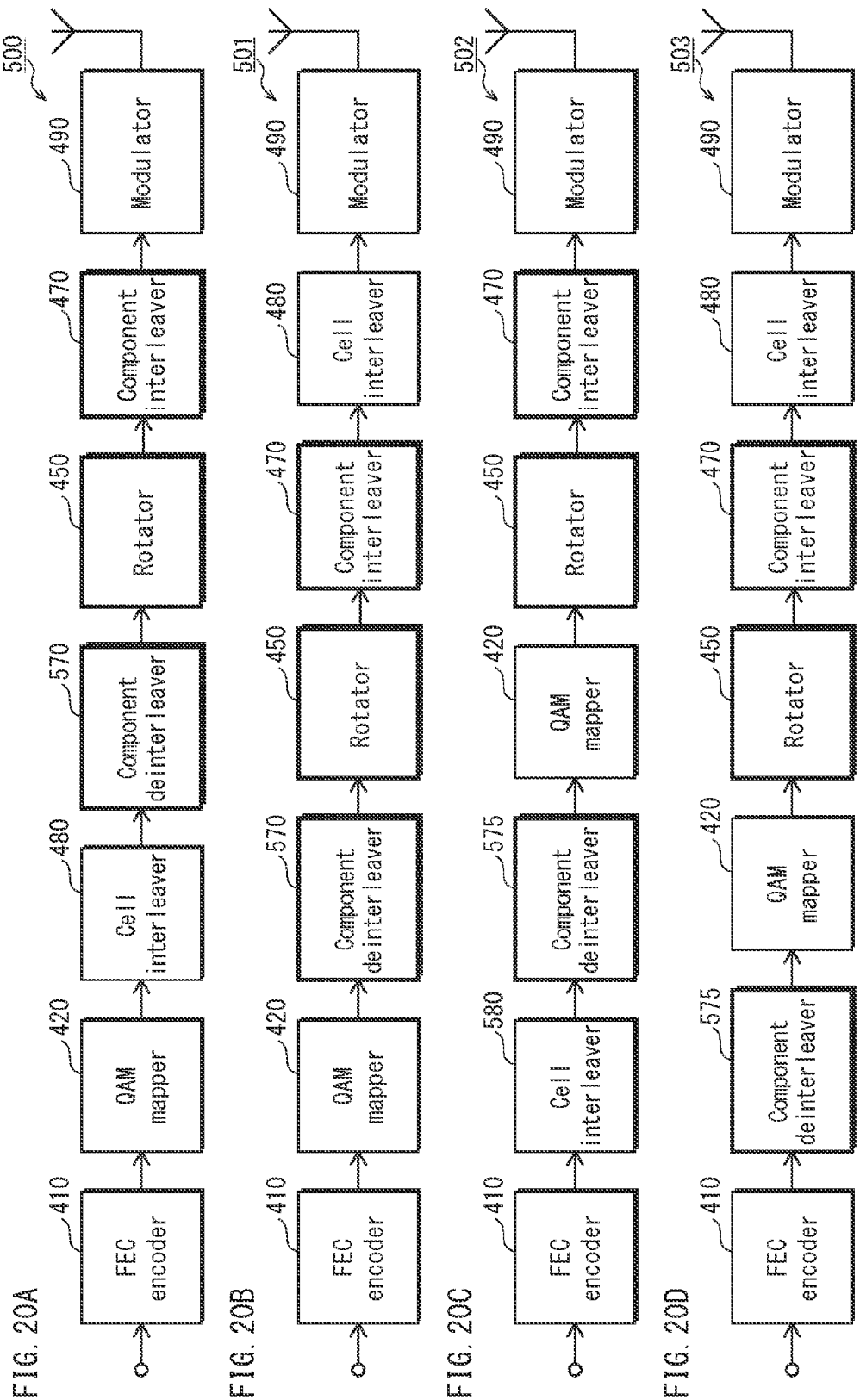
FIG. 20A to FIG. 20D are block diagrams respectively showing the configuration of transmitters 500, 501, 502, and 503 relating to Embodiment 2.

The transmitter 500 in FIG. 20A is equivalent to the transmitter 403 in FIG. 15D in which a component deinterleaver 570 is provided after the cell interleaver 480.

The component deinterleaver 570 applies, to complex cells supplied by the cell interleaver 480, permutation that is the inverse of the permutation applied by the component interleaver 470 which is provided downstream.

Specifically, the component deinterleaver 570 performs, with respect to each of code blocks, processing equivalent to writing D×X complex cells row by row into a matrix with D rows and X columns (component permutation matrix) in the order of input and reading out the written complex cells column by column from the matrix. Note that the component permutation matrix used by the component deinterleaver 570 has the same structure as the component permutation matrix used by the component interleaver 470 which is provided downstream.

FIG. 21 shows in parts (a) and (b) examples of processing performed by the component deinterleaver 570 in the case where a 2D-RC is employed (D=2) and the permutation shown in parts (a) and (b) of FIG. 17 is performed by the component interleaver 470 which is provided downstream. In parts (a) and (b) of FIG. 21 and parts (a) and (b) of FIG. 22 which are later described, squares each represent a complex cell. The number appended to each complex cell is an index number of the complex cell. Outline squares each represent a code block that consists of twelve complex cells.

Here, the component deinterleaver 570 for example writes 2×6 complex cells row by row into a matrix with two rows and six columns in the order of input as shown in part (a) in FIG. 21, and reads out the written complex cells column by column from the matrix as shown in part (b) in FIG. 21. The permutation in parts (a) and (b) in FIG. 21 is an inverse of the permutation performed by the component interleaver 470 in parts (a) and (b) in FIG. 17. Note that the writing order and the reading order are each indicated by an arrow in parts (a) and (b) of FIG. 21, respectively.

FIG. 22 shows in parts (a) and (b) examples of processing performed by the component deinterleaver 570 in the case where a 4D-RC is employed (D=4) and the permutation shown in parts (a) and (b) of FIG. 17 is performed by the component interleaver 470 which is provided downstream.

Here, the component deinterleaver 570 for example writes 4×3 complex cells row by row into a matrix with four rows and three columns in the order of input as shown in part (a) in FIG. 22, and reads out the written complex cells column by column from the matrix as shown in part (b) in FIG. 22. The permutation in parts (a) and (b) in FIG. 22 is an inverse of the permutation performed by the component interleaver 470 in parts (a) and (b) in FIG. 18. Note that the writing order and the reading order are each indicated by an arrow in parts (a) and (b) of FIG. 22, respectively.

The rotator 450 included in the transmitter 500 performs rotation in accordance with the same rule as the above rule used by the rotator 450 included in the transmitter 403 in FIG. 15D. In other words, the rotator 450 included in the transmitter 500 applies a first rotation to one type of D-dimensional vectors having D real components as elements and D-dimensional vectors having D imaginary components as elements, and applies a second rotation to the other type.

Figure 23B:
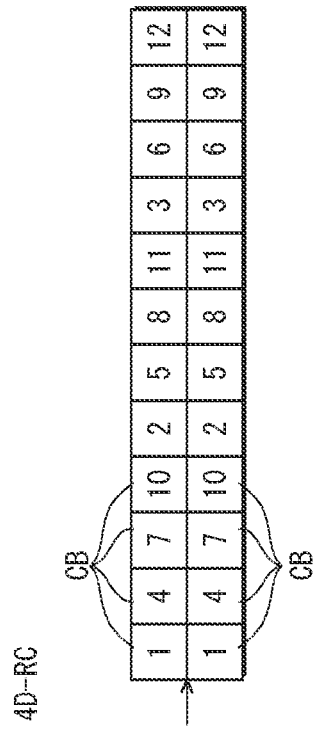
FIG. 23B shows an example of output from the rotator 450 included in the transmitter 500, corresponding to (a) and (b) of FIG. 22.
Figure 23A:
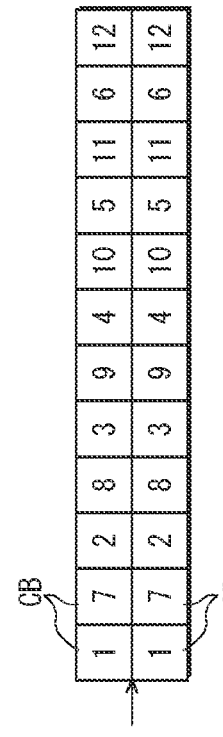
FIG. 23A shows an example of output from a rotator 450 included in the transmitter 500, corresponding to (a) and (b) of FIG. 21.

FIG. 23A shows an example of output from the rotator 450 included in the transmitter 500, which corresponds to the processing performed by the component deinterleaver 570 employing a 2D-RC shown in parts (a) and (b) in FIG. 21. FIG. 23B shows an example of output from the rotator 450 included in the transmitter 500, which corresponds to the processing performed by the component deinterleaver 570 employing a 4D-RC shown in parts (a) and (b) in FIG. 22. Squares each represent a component, columns each represent a complex cell that consists of a pair of real and imaginary components. The upper column represents one of the real and the imaginary components, and the lower column represents the other. Outline squares each represent a code block that consists of twelve complex cells. The numbers appended to the components in FIG. 23A correspond to the index numbers of the complex cells in pars (a) and (b) of FIG. 21. The numbers appended to the components in FIG. 23B correspond to the index numbers of the complex cells in pars (a) and (b) of FIG. 22.

It is clear that as a result of the permutation is applied to the complex cells in FIG. 23A and FIG. 23B by the component interleaver 470, the order of the complex cells is the same as the order of the complex cells that are permuted by the cell interleaver 480, that is, the order of the complex cells before permutation performed by the component deinterleaver 570. In this way, by including the component deinterleaver 570 and the component interleaver 470 in the transmitter 500, it is possible to spread D components of each D-dimensional rotated constellation block over a code block while maintaining the order of the complex cells which are permuted by the cell interleaver 480.

Note that the component deinterleaver and the component interleaver only need to be included in the transmitter so as to sandwich the rotator 450 therebetween, and the processing procedure of the transmitter is not limited to that of the transmitter 500. The transmitter 500 may be modified as shown in FIG. 20B to FIG. 20D.

The transmitter 501 in FIG. 20B is equivalent to the transmitter 500 in which a cell interleaver 480 is provided after the component interleaver 470.

The transmitter 502 in FIG. 20C is equivalent to the transmitter 500 in which the component deinterleaver 570 and the cell interleaver 480 are excluded, a cell interleaver 580 is provided after the FEC encoder, and a component deinterleaver 575 is provided after the cell interleaver 580.

The cell interleaver 580 applies permutation to bits of a supplied code block in units of groups of bits in accordance with the same rule as the rule used by the cell interleaver 480, and outputs the permuted bits to the component deinterleaver 575.

The component deinterleaver 575 applies permutation to the bits of the supplied code block in units of groups of bits in accordance with the same rule as the rule used by the component deinterleaver 570.

Note that the functional configuration of the transmitter 502 is suited to hardware implementation.

The transmitter 503 in FIG. 20D is equivalent to the transmitter 501 in which the component deinterleaver 570 is excluded, and a component deinterleaver 575 is provided after the FEC encoder.

According to the transmitter relating to Embodiment 2, in the case where a D-dimensional rotated constellation is employed, it is possible to spread D components of each D-dimensional rotated constellation block over a code block while maintaining the effects of cell interleaving. This improves the reception performance in the communication systems.

<Receiver and Reception Method>

FIG. 24A is a block diagram showing the configuration of a receiver 600 relating to Embodiment 2 of the present invention. The receiver 600 in FIG. 24A corresponds to the transmitter 500 in FIG. 20A, and mirrors the functionality of the transmitter 500.

The receiver 600 includes a demodulator 610, a component deinterleaver 630, a derotator 650, a component interleaver 670, a cell deinterleaver 620, a QAM demapper 680, and a FEC decoder 690.

In the receiver 600, a signal, which is received by a receive antenna, is first processed by an RF frontend (not shown), typically including a tuner and a down-converter, then by the demodulator 610.

Upon receiving a baseband signal from the RF frontend, the demodulator 610 demodulates the received digital baseband signal. In other words, the demodulator 310 computes channel fading coefficients using the digital baseband signal to generate complex cells using the computed channel fading coefficients.

In order to restore the order of the complex cells to the order before an interleaving performed by the component interleaver 470 included in the transmitter 500, the component deinterleaver 630 applies, to supplied complex cells, a permutation that is the inverse of the permutation performed by the component interleaver 470 included in the transmitter 500.

The component deinterleaver 630 for example performs, with respect to each of supplied code blocks, processing equivalent to writing D×X complex cells row by row into a matrix with D rows and X columns (component permutation matrix) in the order of input and reading out the written complex cells column by column from the matrix. Note that the component permutation matrix used by the component deinterleaver 630 has the same structure as the component permutation matrix used by the component interleaver 470 included in the transmitter 500.

The derotator 650 performs processing of restoring cells to the state before the rotation performed by the rotator 450 included in the transmitter 500.

In order to restore the order of the complex cells to the order before an interleaving performed by the component deinterleaver 570 included in the transmitter 500, the component interleaver 670 applies, to supplied complex cells, a permutation that is the inverse of the permutation performed by the component deinterleaver 570 included in the transmitter 500.

The component interleaver 670 for example performs, with respect to each of the supplied code blocks, processing equivalent to writing D×X complex cells column by column into a matrix with D rows and X columns (component permutation matrix) in the order of input and reading out the written complex cells row by row from the matrix. Note that the component permutation matrix used by the component interleaver 670 has the same structure as the component permutation matrix used by the component deinterleaver 570 included in the transmitter 500.

In order to restore the order of the complex cells to the order before an interleaving performed by the cell interleaver 480 included in the transmitter 500, the cell deinterleaver 620 applies, to the supplied complex cells, a permutation that is the inverse of the permutation performed by the cell interleaver 480 included in the transmitter 500.

The QAM demapper 680 extracts FEC encoded (soft) bits from each of the complex cells output from the cell deinterleaver 620. This method of extracting (soft) bits is well known in this technical field.

In order to restore the order of the extracted bits of the FEC codeword to the order before the interleaving performed by the bit interleaver included in the transmitter 500 (not shown), a deinterleaver (not shown) applies, to the extracted (soft) bits, a permutation that is the inverse of the permutation performed by the bit interleaver, and outputs the permuted soft bits to the FEC decoder 690.

The FEC decoder 690 applies, to the supplied (soft) bits, FEC decoding based on the same FEC code used by the FEC encoder 410 included in the transmitter 500. This decoding method is well known in this technical field.

FIG. 24B to FIG. 24D are block diagrams respectively showing the configuration of receivers 601, 602, and 603 relating to Embodiment 2 of the present invention. The same reference signs are used and description is omitted for constituent elements of the receivers 601, 602, and 603 to which applies the description of the constituent elements of the receiver 600 described above.

The receiver 601 in FIG. 24B corresponds to the transmitter 501 in FIG. 20B, and mirrors the functionality of the transmitter 501.

The receiver 501 is equivalent to the receiver 600 in which a cell deinterleaver 620 is provided after the demodulator 610.

The receiver 602 in FIG. 24C corresponds to the transmitter 502 in FIG. 20C, and mirrors the functionality of the transmitter 502.

The receiver 602 is equivalent to the receiver 600 in which the component interleaver 670 and the cell deinterleaver 620 are excluded, a component interleaver 675 is provided after the QAM demapper 680, and a cell deinterleaver 625 is provided after the component interleaver 675.

The component interleaver 675 applies, to input bits, a permutation that is the inverse of the permutation performed by the component deinterleaver 575 included in the transmitter 502 in FIG. 20C.

The cell deinterleaver 625 applies, to supplied complex cells, a permutation that is the inverse of the permutation performed by the cell interleaver 580 included in the transmitter 502 in FIG. 20C.

The receiver 603 in FIG. 24D corresponds to the transmitter 503 in FIG. 20D, and mirrors the functionality of the transmitter 503.

The receiver 603 is equivalent to the receiver 600 in which the component interleaver 670 is excluded, a cell deinterleaver 620 is provided after the demodulator 610, and a component interleaver 675 is provided after the QAM demapper 620. In order to achieve excellent reception performance, it is desirable to jointly perform derotation and QAM demapping, which are processing relevant to rotated constellation. This is possible only for the structure of the receivers 602 and 603 among the receivers 600 to 603, as no functional block desirably need come between the derotator and the QAM demapper.

<Supplement (1)>

The present invention is not limited to the above embodiments, but rather may be embodied in a variety of ways, such as those described below, for achieving the aim of the present invention or other aims related or associated thereto. For example, the following modifications are possible.

(1) In Embodiment 1, the description has been given that D-dimensional rotated constellation blocks are regarded as constellation blocks. Alternatively, a rotation may be applied to each D-dimensional vector having D/2 real and D/2 imaginary components as elements. Further alternatively, a rotation may be applied to each D-dimensional vector having D real components or D imaginary components as elements such that the rotation is separately applied to the real and imaginary components. In Embodiment 1, the description has been given that each constellation block consists of one or more complex cells. However, in the case where a rotation is separately applied to real and imaginary components, each rotated constellation block consists of D components, in other words, each constellation block consists two or more (transformed) PAM symbols.

(2) In Embodiment 2, the description has been given of the example of the component interleaver 470 and the component deinterleaver 480, regarding that the rotator 450 included in each of the transmitters separately applies a rotation to real and imaginary components such that D components of each D-dimensional vector are allocated to different complex cells. The transmitters relating to Embodiment 2 are each not limited to have this configuration. Alternatively, the rotator 450 may apply a rotation to each D-dimensional vector having D/2 real and D/2 imaginary components. In this case, the component interleaver 470 should perform two permutations like the Q delay inserter: a permutation for allocating D components of each D-dimensional rotated constellation block to different complex cells; and a permutation for spreading D components of each D-dimensional rotated constellation block over a code block. The component deinterleaver 480 should perform permutations in accordance with a rule that is the inverse of the rule used in the permutations performed by the component interleaver 470.

(3) In Embodiment 2, the transmitters each include the component deinterleaver on the upstream side and the component interleaver on the downstream side with the rotator 450 sandwiched therebetween. However, the transmitters in Embodiment 2 are each not limited to have this configuration. Alternatively, the transmitters each may include the component interleaver on the upstream side and the component deinterleaver on the downstream side.

<Supplement (2)>

The following summarizes the transmission method, the transmitter, the reception method, and the receiver relating to the embodiments and so on, as well as the effects thereof.

The first transmission method for transmitting a codeword generated based on a quasi-cyclic low-density parity-check coding scheme including a repeat-accumulate quasi-cyclic low-density parity-check coding scheme, the codeword consisting of N quasi-cyclic blocks, the quasi-cyclic blocks each consisting of Q bits, the transmission method comprising the steps of: applying a bit permutation to the bits of the codeword; dividing the permuted bits of the codeword into a plurality of constellation blocks each consisting of G×M bits; applying a constellation block permutation to the constellation blocks; and transmitting the permuted constellation blocks, wherein the codeword is divided into N/M sections each consisting of M quasi-cyclic blocks, the constellation blocks are each associated with one of the sections, the bit permutation is adapted such that the constellation blocks each consist of G×M bits from M different quasi-cyclic blocks of the associated section, and the constellation block permutation is equivalent to writing the constellation blocks row by row into a matrix with R rows and (Q/(k×G)) columns and reading out the constellation blocks column by column from the matrix, where R is k×(N/M), and k is a positive integer.

According to the first transmission method, it is possible to reduce influence of burst errors and equalize the reception performance on code blocks, thereby improving the reception performance in the communication systems.

In the second transmission method of the first transmission method, the step of applying the bit permutation may include a step of applying a section permutation to the sections independently of each other so as to permute the bits of each of the sections.

According to the second transmission method, it is possible to perform a plurality of section permutations in parallel.

In the third transmission method of the second transmission method, the section permutation may be equivalent to writing the M×Q bits of each of the sections row by row into a matrix with M rows and Q columns and reading out the bits column by column from the matrix.

According to the third transmission method, it is possible to perform a bit interleaving with a high parallelism. Also, sections in the constellation block permutation correspond to sections in the bit permutation.

The first reception method for receiving a codeword generated based on a quasi-cyclic low-density parity-check coding scheme including a repeat-accumulate quasi-cyclic low-density parity-check coding scheme, the codeword consisting of N quasi-cyclic blocks, the quasi-cyclic blocks each consisting of Q bits, the reception method comprising the steps of: receiving a plurality of constellation blocks that have undergone a constellation block permutation on a transmission side, the constellation blocks each consisting of G×M bits; applying an inverse constellation block permutation to the received constellation blocks; transforming the constellation blocks, which have undergone the inverse constellation block permutation, into bits of a codeword that have undergone a bit permutation on the transmission side; and applying an inverse bit permutation to the bits of the codeword, wherein the inverse constellation block permutation is restoration of an order of the constellation blocks that have been permuted in the constellation block permutation of the first transmission method, and the inverse bit permutation is restoration of an order of the bits of the codeword that have been permuted in the bit permutation of the first transmission method.

According to the first transmission method, it is possible to reduce influence of burst errors and equalize the reception performance on code blocks, thereby improving the reception performance in the communication systems.

The first transmitter for transmitting a codeword generated based on a quasi-cyclic low-density parity-check coding scheme including a repeat-accumulate quasi-cyclic low-density parity-check coding scheme, the codeword consisting of N quasi-cyclic blocks, the quasi-cyclic blocks each consisting of Q bits, the transmitter comprising: a bit interleaver applying a bit permutation to the bits of the codeword; a constellation mapper dividing the permuted bits of the codeword into a plurality of constellation blocks each consisting of G×M bits; a constellation block interleaver applying a constellation block permutation to the constellation blocks; and a transmission unit transmitting the permuted constellation blocks, wherein the codeword is divided into N/M sections each consisting of M quasi-cyclic blocks, the constellation blocks are each associated with one of the sections, the bit permutation is adapted such that the constellation blocks each consist of G×M bits from M different quasi-cyclic blocks of the associated section, and the constellation block permutation is equivalent to writing the constellation blocks row by row into a matrix with R rows and (Q/(k×G)) columns and reading out the constellation blocks column by column from the matrix, where R is k×(N/M), and k is a positive integer.

According to the first transmitter, it is possible to reduce influence of burst errors and equalize the reception performance on code blocks, thereby improving the reception performance in the communication systems.

In the second transmitter of the first transmitter, the bit interleaver may include a section interleaver applying a section permutation to the sections independently of each other so as to permute the bits of each of the sections.

According to the second transmitter, it is possible to perform a plurality of section permutations in parallel.

The third transmitter in the second transmitter, wherein the section permutation may be equivalent to writing the M×Q bits of each of the sections row by row into a matrix with M rows and Q columns and reading out the bits column by column from the matrix.

According to the third transmitter, it is possible to perform a bit interleaving with a high parallelism. Also, sections in the constellation block permutation correspond to sections in the bit permutation.

The first receiver for receiving a codeword generated based on a quasi-cyclic low-density parity-check coding scheme including a repeat-accumulate quasi-cyclic low-density parity-check coding scheme, the codeword consisting of N quasi-cyclic blocks, the quasi-cyclic blocks each consisting of Q bits, the receiver comprising: a reception unit receiving a plurality of constellation blocks that have undergone a constellation block permutation on a transmission side, the constellation blocks each consisting of G×M bits; a constellation block deinterleaver applying an inverse constellation block permutation to the received constellation blocks; a transformer transforming the constellation blocks, which have undergone the inverse constellation block permutation, into bits of a codeword that have undergone a bit permutation on the transmission side; and a bit deinterleaver applying an inverse bit permutation to the bits of the codeword, wherein the inverse constellation block permutation is restoration of an order of the constellation blocks that have been permuted in the constellation block permutation of the first transmitter, and the inverse bit permutation is restoration of an order of the bits of the codeword that have been permuted in the bit permutation of the first transmitter.

According to the first receiver, it is possible to reduce influence of burst errors and equalize the reception performance on code blocks, thereby improving the reception performance in the communication systems.

The fourth transmission method for transmitting digital data, the transmission method comprising the steps of: encoding a block of data with a forward error correction code; generating a plurality of first complex symbols from the encoded block of data, the first complex symbols each consisting of respective real-valued symbols as a real component and an imaginary component; applying a complex symbol permutation to the first complex symbols; applying a first symbol permutation to the real-valued symbols constituting the first complex symbols which have undergone the complex symbol permutation; dividing the permuted real-valued symbols, which have undergone the first symbol permutation, into a plurality of D-dimensional vectors each consisting of D real-valued symbols, and transforming each of the D-dimensional vectors into a D-dimensional rotated vector by applying a rotation to the D-dimensional vector, the rotation being multiplication of the D-dimensional vector by an orthogonal matrix that is a matrix for spreading values of elements in each dimension of the D-dimensional vector over at least two dimensions; applying a second symbol permutation to a plurality of transformed real-valued symbols constituting the D-dimensional rotated vectors, the second symbol permutation being an inverse of the first symbol permutation; and transmitting a plurality of second complex symbols each consisting of the respective transformed real-valued symbols as a real component and an imaginary component, which have undergone the second symbol permutation.

According to the fourth transmission method, in the case where a D-dimensional rotated constellation is employed, it is possible to spread D components of each D-dimensional rotated constellation block over a code block while maintaining effects of a complex symbol permutation (cell interleaving). This improves the reception performance in the communication systems.

In the fifth transmission method of the fourth transmission method, the second symbol permutation may be adapted such that D transformed real-valued symbols of each of the D-dimensional rotated vectors are each allocated to a different one of the second complex symbols.

According to the fifth transmission method, it is possible to more appropriately spread D components of each D-dimensional rotated constellation block.

In the sixth transmission method of the fourth transmission method, the second symbol permutation may be adapted such that D transformed real-valued symbols of each of the D-dimensional rotated vectors are spread as evenly as possible over a block of data of the transformed real-valued symbols.

According to the sixth transmission method, it is possible to more appropriately spread D components of each D-dimensional rotated constellation block.

The fourth transmitter for transmitting digital data, the transmitter comprising: an encoder encoding a block of data with a forward error correction code; a generator generating a plurality of first complex symbols from the encoded block of data, the first complex symbols each consisting of respective real-valued symbols as a real component and an imaginary component; a complex symbol interleaver applying a complex symbol permutation to the first complex symbols; a first symbol interleaver applying a first symbol permutation to the real-valued symbols constituting the first complex symbols which have undergone the complex symbol permutation; a transformer dividing the permuted real-valued symbols, which have undergone the first symbol permutation, into a plurality of D-dimensional vectors each consisting D real-valued symbols, and transforming each of the D-dimensional vectors into a D-dimensional rotated vector by applying a rotation to the D-dimensional vector, the rotation being multiplication of the D-dimensional vector by an orthogonal matrix that is a matrix for spreading values of elements in each dimension of the D-dimensional vector over at least two dimensions; a second symbol interleaver applying a second symbol permutation to a plurality of transformed real-valued symbols constituting the D-dimensional rotated vectors, the second symbol permutation being an inverse of the first symbol permutation; and a transmission unit transmitting a plurality of second complex symbols each consisting of the respective transformed real-valued symbols as a real component and an imaginary component, which have undergone the second symbol permutation.

According to the fourth transmitter, in the case where a D-dimensional rotated constellation is employed, it is possible to spread D components of each D-dimensional rotated constellation block over a code block while maintaining effects of a complex symbol permutation (cell interleaving). This improves the reception performance in the communication systems.

The second reception method for receiving digital data, the reception method comprising the steps of: receiving a plurality of first complex symbols each consisting of respective real-valued symbols as a real component and an imaginary component; applying a first symbol permutation to the real-valued symbols constituting the first complex symbols; dividing the real-valued symbols, which have undergone the first symbol permutation, into a plurality of D-dimensional vectors each consisting D real-valued symbols, and transforming each of the D-dimensional vectors into a D-dimensional rotated vector by applying a rotation to the D-dimensional vector, the rotation being multiplication of the D-dimensional vector by an orthogonal matrix that is a matrix for spreading values of elements in each dimension of the D-dimensional vector over at least two dimensions; applying a second symbol permutation to a plurality of transformed real-valued symbols constituting the D-dimensional vectors, the second symbol permutation being an inverse of the first symbol permutation; applying a complex symbol permutation to a plurality of second complex symbols each consisting of the transformed real-valued symbols which have undergone the second symbol permutation; generating an encoded block of data from the second complex symbols which have undergone the complex symbol permutation; and decoding the encoded block of data with a forward error correction code.

According to the second reception method, in the case where a D-dimensional rotated constellation is employed, it is possible to spread D components of each D-dimensional rotated constellation block over a code block while maintaining effects of a complex symbol permutation (cell interleaving). This improves the reception performance in the communication systems.

The second receiver for receiving digital data, the receiver comprising: a reception unit receiving a plurality of first complex symbols each consisting of respective real-valued symbols as a real component and an imaginary component; a first symbol interleaver applying a first symbol permutation to the real-valued symbols constituting the first complex symbols; a transformer dividing the real-valued symbols, which have undergone the first symbol permutation, into a plurality of D-dimensional vectors each consisting D real-valued symbols, and transforming each of the D-dimensional vectors into a D-dimensional rotated vector by applying a rotation to the D-dimensional vector, the rotation being multiplication of the D-dimensional vector by an orthogonal matrix that is a matrix for spreading values of elements in each dimension of the D-dimensional vector over at least two dimensions; a second symbol interleaver applying a second symbol permutation to a plurality of transformed real-valued symbols constituting the D-dimensional vectors, the second symbol permutation being an inverse of the first symbol permutation; a complex symbol interleaver applying a complex symbol permutation to a plurality of second complex symbols each consisting of the transformed real-valued symbols which have undergone the second symbol permutation; a generator generating an encoded block of data from the second complex symbols which have undergone the complex symbol permutation; and a decoder decoding the encoded block of data with a forward error correction code.

According to the second receiver, in the case where a D-dimensional rotated constellation is employed, it is possible to spread D components of each D-dimensional rotated constellation block over a code block while maintaining effects of a complex symbol permutation (cell interleaving). This improves the reception performance in the communication systems.

The present invention is useful for digital data transmission and reception arts.

REFERENCE SIGNS LIST 100 transmitter
110 LDPC encoder
120, 120a bit interleaver
130 constellation mapper
140 cell interleaver
150 modulator
200 transmitter
240 constellation block interleaver
300 receiver
310 demodulator
320 constellation block deinterleaver
330 constellation demapper
340 bit deinterleaver
350 LDPC decoder
400, 401, 402, 403 transmitter
410 FEC encoder
420 QAM mapper
450 rotator
460 component separator
465 Q delay inserter
470 component interleaver
480 cell interleaver
490 demodulator
500, 501, 502, 503 transmitter
570, 575 component deinterleaver
580 cell interleaver
600, 601, 602, 603 receiver
610 demodulator
620, 625 cell deinterleaver
630 component deinterleaver
650 derotator
670, 675 component interleaver
680 QAM demapper
690 FEC decoder

The invention claimed is:

1. A transmission method for transmitting a codeword generated based on a quasi-cyclic low-density parity-check coding scheme including a repeat-accumulate quasi-cyclic low-density parity-check coding scheme, the codeword consisting of N bit groups, the bit groups each consisting of Q bits, the transmission method comprising the steps of:
   generating, using a generator, a plurality of constellation blocks from the codeword, each of the plurality of constellation blocks being generated from G×M bits;
   applying, using a constellation block interleaver, a constellation block permutation to the constellation blocks; and
   transmitting, using a transmission unit, the permuted constellation blocks,
   wherein each of the bit groups is allocated to one of N/M sections, each section consisting of M different bit groups,
   each of the constellation blocks consists of G bits from each of the M different bit groups, and
   the constellation block permutation is equivalent to writing the constellation blocks row by row into a matrix with R rows and (Q/(k×G)) columns and reading out the constellation blocks column by column from the matrix, where R is k×(N/M), and k, N, Q, G, M, and R are positive integers.

2. A reception method for receiving a codeword generated based on a quasi-cyclic low-density parity-check coding scheme including a repeat-accumulate quasi-cyclic low-density parity-check coding scheme, the codeword consisting of N bit groups, the bit groups each consisting of Q bits, the codeword undergoing predetermined processing and then being transmitted by a transmitter, the predetermined processing including:
   generating a plurality of constellation blocks from the codeword, each of the plurality of constellation blocks being generated from G×M bits; and
   permuting the constellation blocks, wherein each of the bit groups is allocated to one of N/M sections, each section consisting of M different bit groups, each of the constellation blocks consists of G bits from each of the M different bit groups, and the permuting of the constellation blocks is equivalent to writing the constellation blocks row by row into a matrix with R rows and (Q/(k×G)) columns and reading out the constellation blocks column by column from the matrix, where R is k×(N/M), and k, N, Q, G, M, and R are positive integers, the reception method comprising the steps of:
receiving, using a reception unit, a plurality of constellation blocks that have undergone a constellation block permutation on a transmission side, the constellation blocks each consisting of G×M bits;
applying, using a constellation block deinterleaver, an inverse constellation block permutation to the received constellation blocks; and
transforming, using a transformer, the constellation blocks, which have undergone the inverse constellation block permutation, into bits of a codeword;
wherein the inverse constellation block permutation is restoration of an order of the constellation blocks that have been permuted in the constellation block permutation.

3. A transmitter for transmitting a codeword generated based on a quasi-cyclic low-density parity-check coding scheme including a repeat-accumulate quasi-cyclic low-density parity-check coding scheme, the codeword consisting of N bit groups, the bit groups each consisting of Q bits, the transmitter comprising:
a generator generating a plurality of constellation blocks from the codeword, each of the plurality of constellation blocks being generated from G×M bits;
a constellation block interleaver applying a constellation block permutation to the constellation blocks; and
a transmission unit transmitting the permuted constellation blocks, wherein each of the bit groups is allocated to one of N/M sections, each section consisting of M bit groups, each of the constellation blocks consists of G bits from each of the M different bit groups, and the constellation block permutation is equivalent to writing the constellation blocks row by row into a matrix with R rows and (Q/(k×G)) columns and reading out the constellation blocks column by column from the matrix, where R is k×(N/M), and k, N, Q, G, M, and R are positive integers.

4. A receiver for receiving a codeword generated based on a quasi-cyclic low-density parity-check coding scheme including a repeat-accumulate quasi-cyclic low-density parity-check coding scheme, the codeword consisting of N bit groups, the bit groups each consisting of Q bits, the codeword undergoing predetermined processing and then being transmitted by a transmitter, the predetermined processing including:
generating a plurality of constellation blocks from the codeword, each of the plurality of constellation blocks being generated from G×M bits; and
permuting the constellation blocks,
wherein the codeword is divided into N/M sections each consisting of M quasi-cyclic blocks, each of the constellation blocks consists of G bits from each of the M different bit groups, and the permuting of the constellation blocks is equivalent to writing the constellation blocks row by row into a matrix with R rows and (Q/(k×G)) columns and reading out the constellation blocks column by column from the matrix, where R is k×(N/M), and k, N, Q, G, M, and R are positive integers, the receiver comprising:
a reception unit receiving a plurality of constellation blocks that have undergone a constellation block permutation on a transmission side, the constellation blocks each consisting of G×M bits;
a constellation block deinterleaver applying an inverse constellation block permutation to the received constellation blocks; and
a transformer transforming the constellation blocks, which have undergone the inverse constellation block permutation, into bits of a codeword;
wherein,
the inverse constellation block permutation is restoration of an order of the constellation blocks that have been permuted in the constellation block permutation.

* * * * *